(12) United States Patent
Tega et al.

(10) Patent No.: US 12,174,220 B2
(45) Date of Patent: Dec. 24, 2024

(54) HEATER SUBSTRATE, PROBE CARD SUBSTRATE, AND PROBE CARD

(71) Applicant: KYOCERA Corporation, Kyoto (JP)

(72) Inventors: Hitoshi Tega, Kyoto (JP); Takeshi Hasegawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 181 days.

(21) Appl. No.: 17/795,981

(22) PCT Filed: Jan. 22, 2021

(86) PCT No.: PCT/JP2021/002299
§ 371 (c)(1),
(2) Date: Jul. 28, 2022

(87) PCT Pub. No.: WO2021/153461
PCT Pub. Date: Aug. 5, 2021

(65) Prior Publication Data
US 2023/0085111 A1    Mar. 16, 2023

(30) Foreign Application Priority Data
Jan. 30, 2020  (JP) ................................. 2020-013086

(51) Int. Cl.
*G01R 1/073*      (2006.01)
*H05B 3/28*       (2006.01)

(52) U.S. Cl.
CPC .......... *G01R 1/07342* (2013.01); *H05B 3/28* (2013.01)

(58) Field of Classification Search
CPC ............ G01R 1/07342; G01R 1/06761; G01R 1/07314; G01R 1/073; G01R 31/2851; G01R 31/2863; G01R 31/26; H05B 2203/014; H05B 3/283; H05B 3/03;
(Continued)

(56) References Cited

U.S. PATENT DOCUMENTS 5,895,591 A * 4/1999 Kojima .............. G01N 27/4067
                                                            204/426
7,812,627 B2 * 10/2010 Yamamoto ......... G01R 31/2875
                                                            324/750.05
(Continued)

FOREIGN PATENT DOCUMENTS

JP    2002-246152 A    8/2002
JP    2003-077783 A    3/2003
(Continued)

*Primary Examiner* — Christopher P McAndrew
(74) *Attorney, Agent, or Firm* — Volpe Koenig

(57) ABSTRACT

Provided is a heater substrate that includes an insulating substrate having a first surface and a second surface that is on an opposite side from the first surface, a heater wire located inside the insulating substrate, and an adjustment part that is electrically connected to the heater wire. The adjustment part includes a pair of adjustment terminals that are located on the second surface and are respectively electrically connected to two ends of a partial section of the heater wire, and an adjustment conductor that is located on the second surface and is connected to the pair of adjustment terminals. Also provided are a probe card substrate and a probe card that include the heater substrate.

20 Claims, 15 Drawing Sheets

(58) Field of Classification Search
CPC . H05B 3/02; H05B 3/265; H05B 3/12; H05B 3/16; H05B 3/28; H01L 22/00
USPC .................................................. 324/754.03
See application file for complete search history.

(56) References Cited

U.S. PATENT DOCUMENTS

| | | | |
|---|---|---|---|
| 8,240,650 B2 * | 8/2012 | Teich ................ | H01L 21/68757 |
| | | | 269/21 |
| 8,376,017 B2 * | 2/2013 | Lee .................... | B32B 38/10 |
| | | | 156/752 |
| 9,622,588 B2 * | 4/2017 | Brykalski .............. | A47C 21/04 |
| 2016/0126125 A1 | 5/2016 | Okugawa et al. | |
| 2021/0005480 A1 * | 1/2021 | Divakar ................. | B32B 18/00 |

FOREIGN PATENT DOCUMENTS

| | | | | |
|---|---|---|---|---|
| JP | 2010-151497 A | 7/2010 | | |
| KR | 2007-0010068 A | 1/2007 | | |
| KR | 2018-0068330 A | 6/2018 | | |
| WO | WO-2014008241 A1 * | 1/2014 | ............. | H01C 17/06 |
| WO | WO-2016088670 A1 * | 6/2016 | ............. | H01H 37/76 |
| WO | WO-2021107115 A1 * | 6/2021 | ......... | G01R 1/07307 |

* cited by examiner

HEATER SUBSTRATE, PROBE CARD SUBSTRATE, AND PROBE CARD

TECHNICAL FIELD

The present disclosure relates to a heater substrate, a probe card substrate, and a probe card.

BACKGROUND

Japanese Unexamined Patent Application Publication No. 2010-151497 discloses a probe card substrate used in electrical testing of semiconductor elements in a wafer state. This probe card substrate includes a heater substrate having a heater wire inside an insulating substrate.

SUMMARY

A heater substrate according to the present disclosure includes
- an insulating substrate having a first surface and a second surface on an opposite side from the first surface,
- a heater wire located inside the insulating substrate,
- and an adjustment part that is electrically connected to the heater wire.

The adjustment part includes
- a pair of adjustment terminals that are located on the second surface and are respectively electrically connected to two ends of a partial section of the heater wire, and
- an adjustment conductor that is located on the second surface and is connected to the pair of adjustment terminals.

A probe card substrate according to the present disclosure includes
- the above heater substrate, which includes a plurality of first circuit conductors located from the first surface to the second surface and insulated from the heater wire, and
- a circuit substrate located on the first surface of the heater substrate and including a plurality of second circuit conductors.

The plurality of second circuit conductors are connected to the plurality of first circuit conductors.

A probe card according to the present disclosure includes
- the above probe card substrate and a plurality of probe pins connected to the plurality of second circuit conductors.

DETAILED DESCRIPTION

Figure 1A:
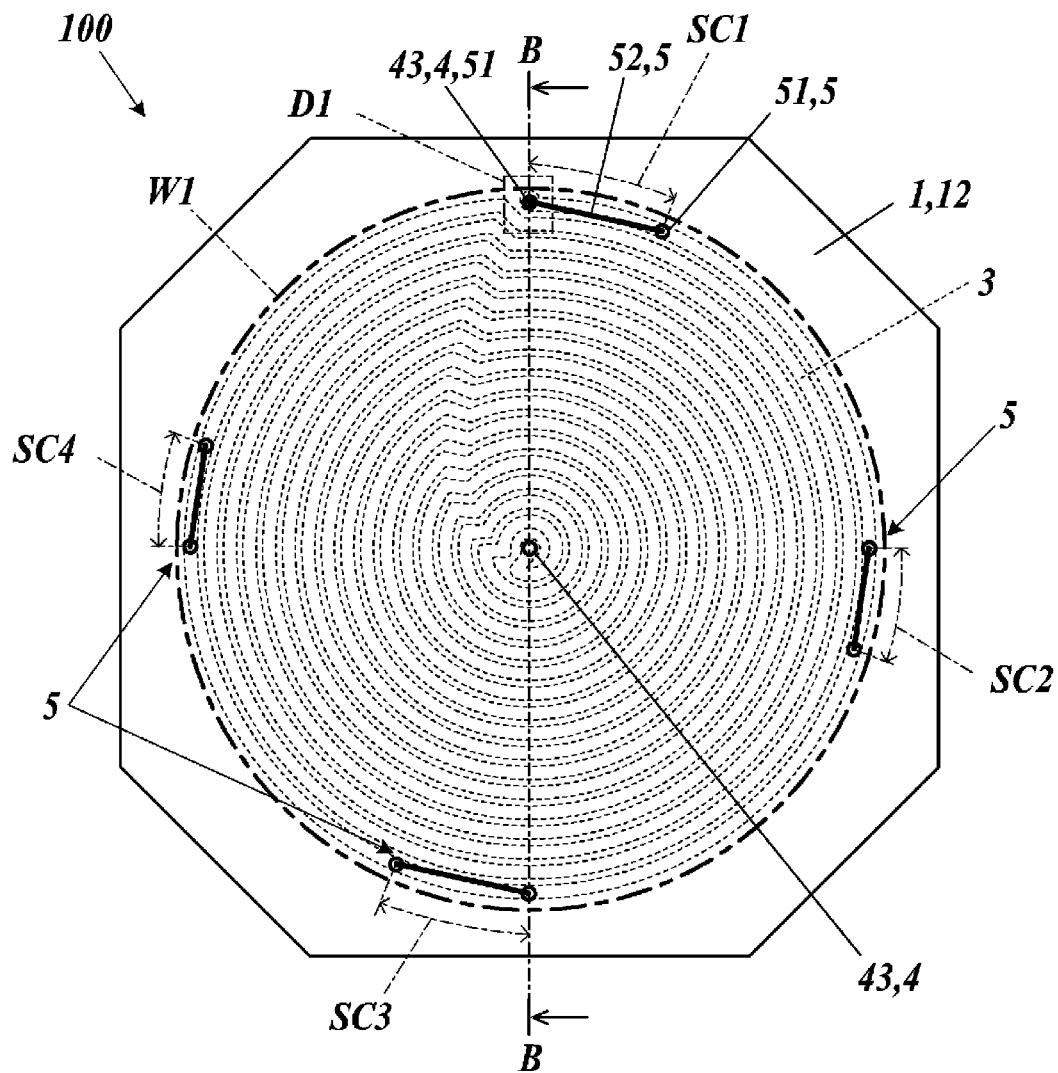
FIG. 1A is a plan view from a second surface side of a heater substrate according to Embodiment 1 of the present disclosure.

Hereafter, embodiments of the present disclosure will be described in detail while referring to the drawings. Note that the drawings used in the following descriptions are schematic drawings, and distinctions between above and below are for convenience of description and do not restrict what is above and below when a circuit substrate and so on are actually used.

Embodiment 1

Figure 1B:
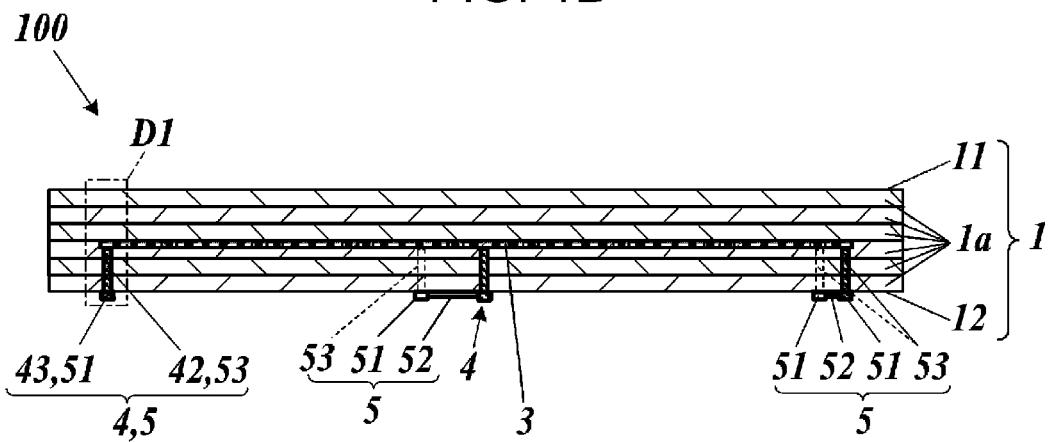
FIG. 1B is a sectional view taken along line B-B in FIG. 1A.

FIG. 1A is a plan view from a second surface side of a heater substrate according to Embodiment 1 of the present disclosure. FIG. 1B illustrates a sectional view taken along line B-B in FIG. 1A. A heater substrate 100 of an embodiment of the present disclosure includes an insulating substrate 1 having a first surface 11 and a second surface 12 on the opposite side from the first surface, a heater wire 3 located inside the insulating substrate 1, and a plurality of adjustment parts 5 that are electrically connected to partial sections SC1 to SC4 of the heater wire 3.

The insulating substrate 1 is a multilayer body in which a plurality of ceramic insulating layers 1a are stacked and has an insulating property.

The heater wire 3 is a metalized conductor that is fired together with the plurality of ceramic insulating layers 1a and is located between the plurality of ceramic insulating layers 1a. The material of heater wire 3 is, for example, tungsten, but molybdenum or manganese may be used, or an alloy metal containing a plurality of metal components such as tungsten, molybdenum, manganese, and copper may be used. The heater wire 3 has a line pattern that fills a heating region W1 of the insulating substrate 1 and generates joule heat (generates heat) when a current flows therealong. The heating region W1 is a region of the insulating substrate 1 that is set so as to heated. The heating region W1 is a region in which the line pattern of the heater wire 3 is disposed and corresponds to an arrangement region of the heater wire 3.

The heating region W1 may be a region including a part where an object to be heated faces the heater substrate 100 and, for example, if the heater substrate 100 is incorporated into a probe card, may be a region including a part facing a wafer SW. The two end portions of the heater wire 3 are connected to power-feeding conductors 4. The power-feeding conductors 4 include power-feeding terminals 43 located on the second surface 12 and inner conductors 42 that are located inside the insulating substrate 1 and electrically connect the power-feeding terminals 43 and end portions of the heater wire 3 to each other. The pair of power-feeding terminals 43 are terminals for feeding power to the heater wire 3. The inner conductors 42 are, for example, via conductors that extend in a direction perpendicular to a substrate surface (first surface 11 or second surface 12) of the insulating substrate 1 and are located from the second surface 12 to the heater wire 3. The inner conductors 42 may include conductors that extend in a direction along a substrate surface of the insulating substrate 1.

The plurality of adjustment parts 5 are respectively connected in parallel with the partial sections SC1 to SC4 of the heater wire 3. The currents flowing through the heater wire 3 and the sections SC1 to SC4 of the heater wire 3 can be adjusted by adjusting the design of the electrical resistances of the adjustment parts 5. Each adjustment part 5 includes a pair of inner conductors 53 connected to the two ends of the corresponding section SC1 (or any of SC2 to SC4) of the heater wire 3, a pair of adjustment terminals 51 connected to the pair of inner conductors 53, and an adjustment conductor 52 connected between the pair of adjustment terminals 51. The inner conductors 53 are, for example, via conductors that extend in a direction perpendicular to a substrate surface (first surface 11 or second surface 12) of the insulating substrate 1 and are located from the second surface 12 to the heater wire 3. The adjustment terminals 51 and the adjustment conductor 52 are located on the second surface 12. The inner conductors 53 are fired together with the plurality of ceramic insulating layers 1a.

As illustrated in region D1 in FIG. LA, a power-feeding point of the heater wire 3 and a connection point of the adjustment part 5 may be the same point, and in this case, the same terminal serves as both the power-feeding terminal 43 and the adjustment terminal 51 and the same terminal serves as both the power-feeding inner conductor 42 and the inner conductor 53 of the adjustment part 5.

The adjustment conductors 52 are formed of a metal material (for example, copper) having a different resistance ratio from the heater wire 3. The specific resistance of the adjustment conductors 52 is smaller than the specific resistance of the heater wire 3, but may instead be larger. The adjustment conductors 52 are formed using a separate pattern forming process performed after the process of firing the insulating substrate 1. The line width, pattern length, thickness, and material of each adjustment conductor 52 can be selected as to bring the value of a current flowing through the heater wire 3 and the section SC1 (or any of SC2 to SC4) connected to the adjustment part 5 close to a target value on the basis of measurement results of the resistance value of the heater wire 3 after firing the insulating substrate 1 containing the heater wire 3.

In Embodiment 1, the plurality of adjustment parts 5 are located in an outer peripheral portion inside the heating region W1 and are disposed in a distributed manner across the second surface 12. "Disposed in a distributed manner" means that when the second surface 12 is equally divided into three or more regions by radial dividing lines extending from the center of the second surface 12, an adjustment part 5 is contained in each of the divided regions. Alternatively, "disposed in a distributed manner" means that, in the case where the second surface 12 is long in one direction, when the second surface 12 is divided into three or more equally spaced regions in the longitudinal direction, an adjustment part 5 is contained in each of the divided regions.

Due to presence of the adjustment parts 5, when there are variations in the amount of heat generated between lots or between individual substrates for the fired insulating substrate 1 containing the heater wire 3 or when there are variations in the amount of heat generated or deviations from a target value between individual areas within the heating region W1, such variations can be corrected. In other words, after firing the insulating substrate 1 containing the heater wire 3, the resistances of the heater wire 3 and the sections SC1 to SC4 are measured and deviations from the target values of the resistances are calculated. Next, resistance values of the adjustment conductors 52 that would enable these deviations to be reduced are determined and the patterns and materials of the adjustment conductors 52 are selected so as to realize the determined resistance values. Next, the adjustment conductors 52 are formed on the second surface 12 of the insulating substrate 1, thereby allowing the above-described variations to be corrected and allowing the total amount of heat generated by the heater wire 3 and the amounts of heat generated in the individual regions to be brought close to the target values. Since the heater wire 3 is located inside the insulating substrate 1, it is difficult to trim the heater wire 3 once the insulating substrate 1 has been fired, but the amount of heat generated by the heater wire 3 can be adjusted by providing the adjustment terminals 51 and the inner conductors 53 of the adjustment parts 5 and connecting the adjustment conductors 52 once the insulating substrate 1 has been fired.

In addition, the plurality of adjustment parts 5 are disposed so as to be distributed across the second surface 12 and this enables adjustments to be made so as to reduce variations in the amount of heat generated between individual parts inside the heating region W1 and variations in deviations of the amounts of heat generated from the desired values when such variations occur.

Furthermore, since the specific resistance of the adjustment conductors 52 is different from the specific resistance of the heater wire 3, a conductor with a large specific resistance and a conductor with a small specific resistance can be employed, and this increases the degree of freedom when designing the resistances of the adjustment conductors 52.

Embodiment 2

Figure 2:
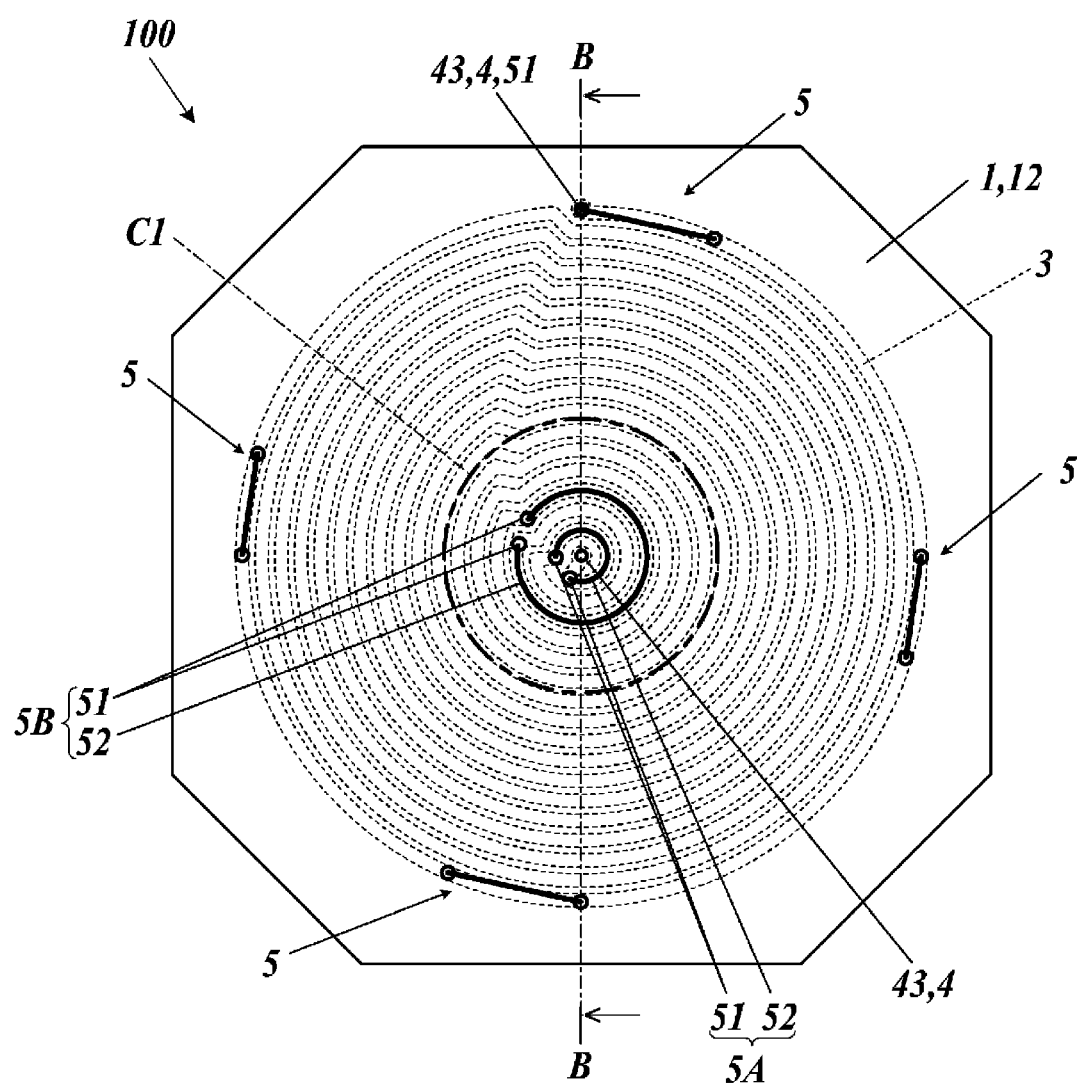
FIG. 2 is a plan view from a second surface side of a heater substrate according to Embodiment 2 of the present disclosure.

FIG. 2 is a plan view from a second surface side of a heater substrate according to Embodiment 2 of the present disclosure. A heater substrate 100 of Embodiment 2 includes adjustment parts 5A and 5B located at a center part C1 of a second surface 12. In this specification, "the center part C1 of the insulating substrate 1" refers to a region within an oval that is centered at the vertical and horizontal center of the second surface and is ⅓ the vertical dimension and ⅓ the horizontal dimension of the second surface.

In the center part C1 of the insulating substrate 1, heat from the heater wire 3 moves towards the first surface 11, towards the second surface 12, and in directions along a substrate surface (first surface 11 or second surface 12), but the heat finds it more difficult to move in the directions along the substrate surface due to the presence of the adjacent separate sections of the heater wire 3. Therefore, heat tends to build up in the center part C1. The adjustment parts 5A and 5B located in the center part C1 act so as to reduce the amount of heat generated in the center part C1, and therefore it is easy to perform adjustment when equalizing the heating temperature between an inner portion and an outer portion of the center part C1 in the heater substrate 100, in which the line pattern of the heater wire 3 is disposed so as to fill the heating region. The "heating temperature" refers to the temperature of the first surface 11 when the heater wire 3 is driven.

(Modification 1)

Figure 3:
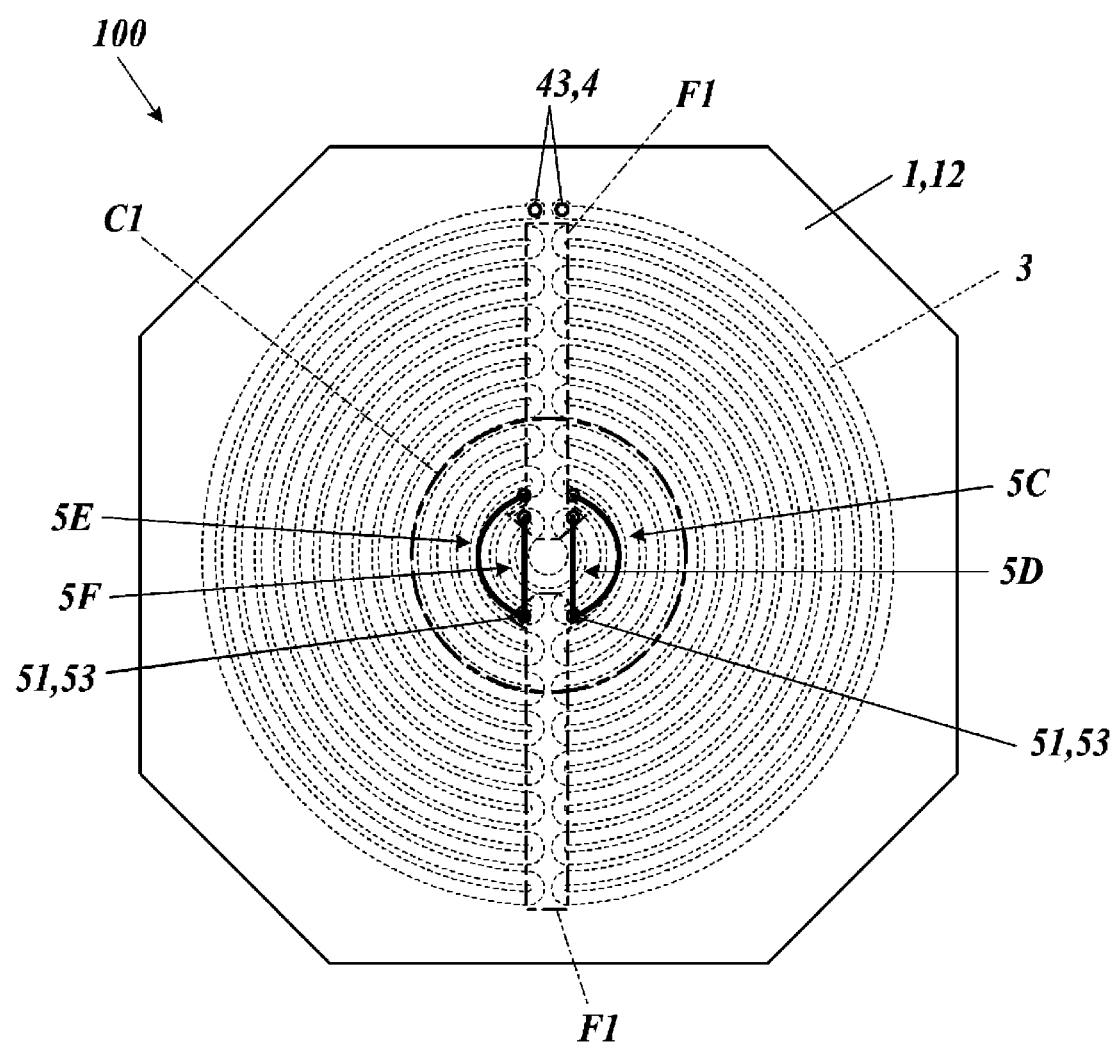
FIG. 3 is a plan view from a second surface side of a heater substrate of Modification 1.
Figure 4:
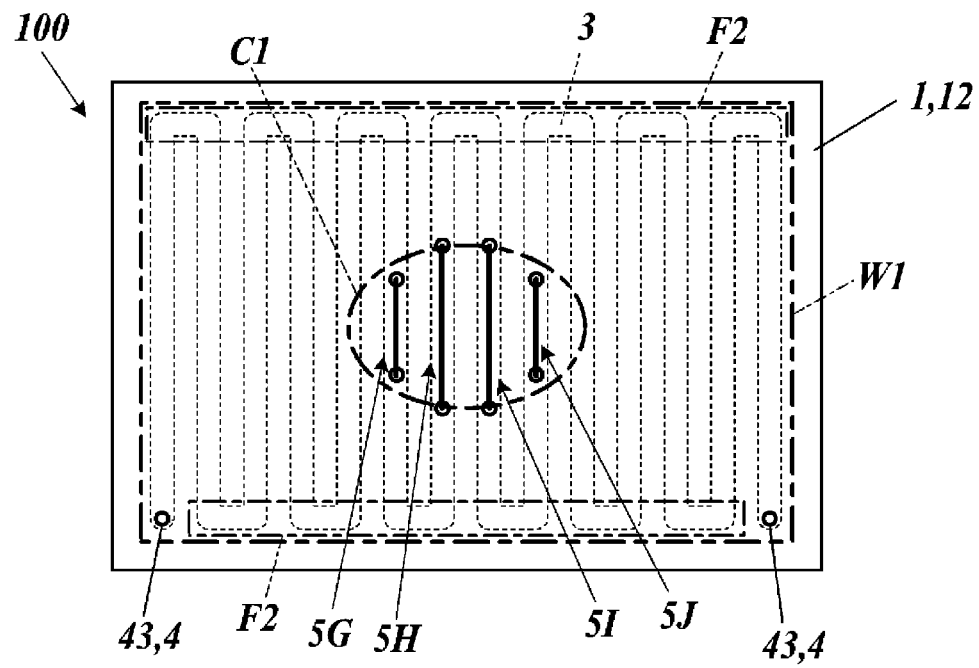
FIG. 4 is a plan view from a second surface side of a heater substrate of Modification 2.
Figure 5:
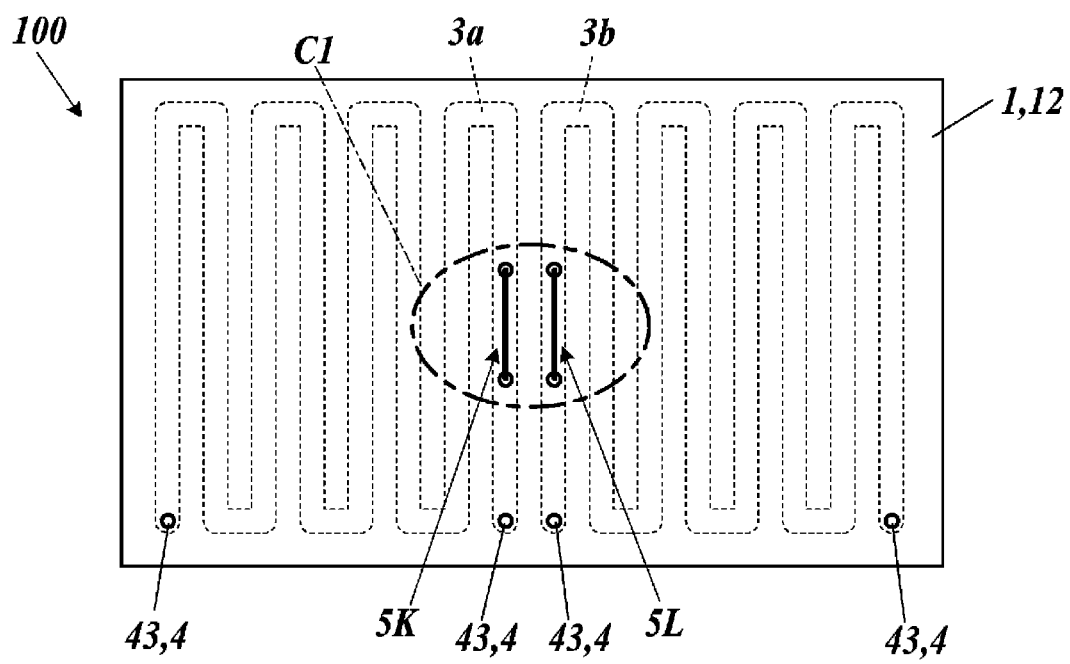
FIG. 5 is a plan view from a second surface side of a heater substrate of Modification 3.
Figure 6:
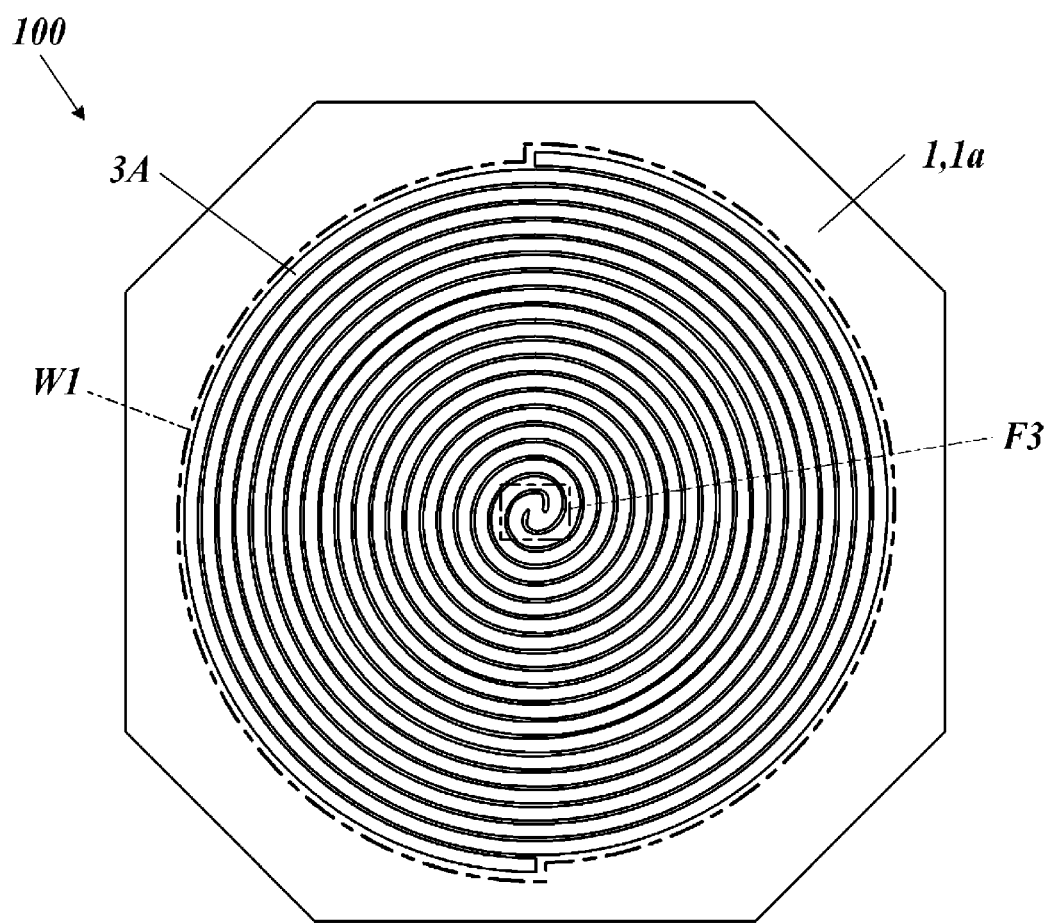
FIG. 6 is a plan view illustrating a heater wire pattern of Modification 4.
Figure 7:
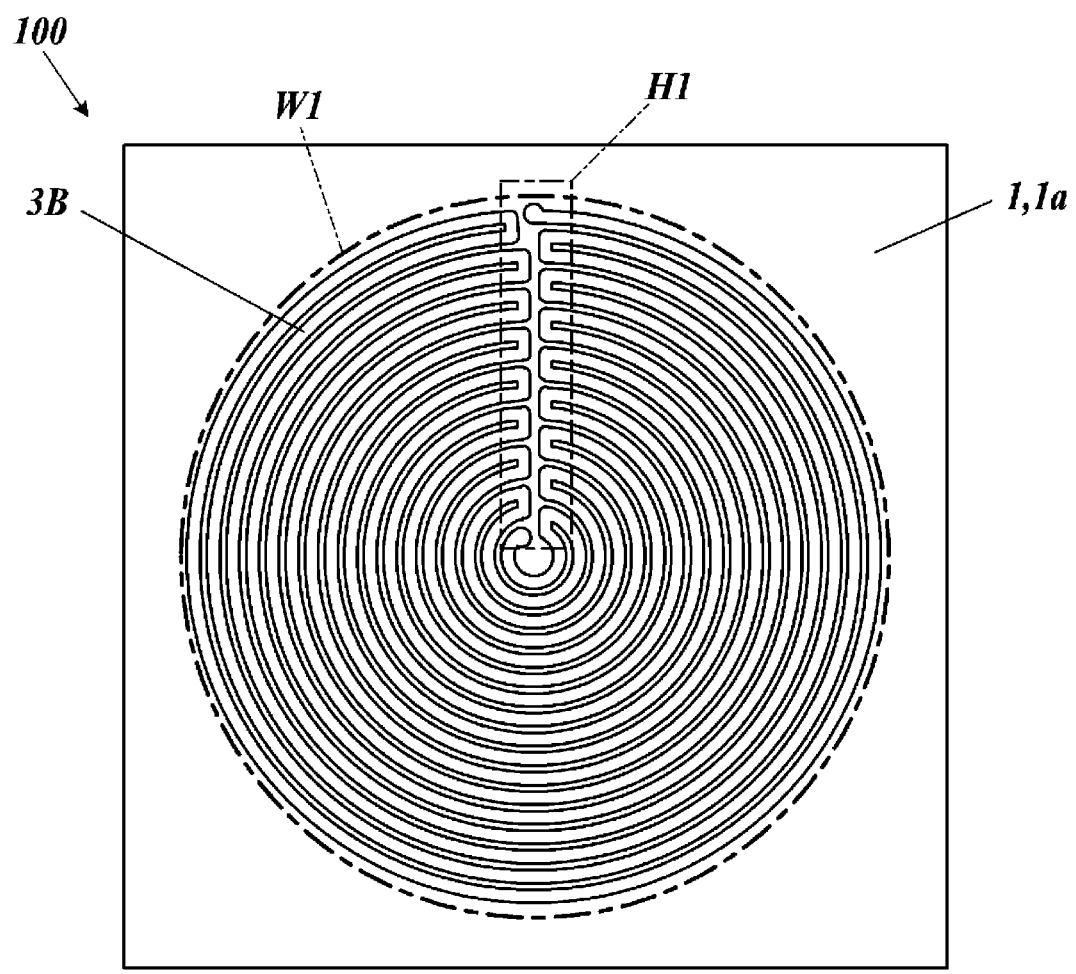
FIG. 7 is a plan view illustrating a heater wire pattern of Modification 5.

FIGS. 3 to 5 are plan views from a second surface side of heater substrates of Modifications 1 to 3. A heater substrate 100 of Modification 1 (FIG. 3) includes a laterally symmetrical line pattern of a heater wire 3 and laterally symmetrical adjustment parts 5C to 5F. When the adjustment parts 5C and 5D are adjacent to each other, the adjustment parts 5C and 5D are located in a center part C1 of a second surface 12. One adjustment terminal 51 and one inner conductor 53 included in the adjustment part 5C and one adjustment terminal 51 and one inner conductor 53 included in the adjacent adjustment part 5D may be realized using the same adjustment terminal and the same inner conductor. When the adjustment parts 5E and 5F are adjacent to each other, one adjustment terminal 51 and one inner conductor 53 included in the adjustment part 5E and one adjustment terminal 51 and one inner conductor 53 included in the adjacent adjustment part 5F may be realized using the same adjustment terminal and the same inner conductor.

The amounts of heat generated can be adjusted while easily maintaining a laterally symmetrical heat generation distribution by providing the laterally symmetrical adjustment parts 5C to 5F for the laterally symmetrical heater wire 3. Furthermore, if the target temperature distribution is laterally symmetrical, but the characteristics of the heater wire 3 are shifted from being laterally symmetrical, a laterally symmetrical heat generation distribution can still be achieved with high precision by making the adjustment conductors 52 of the adjustment parts 5C to 5F have resistance values that vary laterally. Laterally symmetrical adjustment parts may be positioned outside the center part C1.

Positioning the adjustment parts 5C to 5F of Modification 1 in the center part C1 of the second surface 12 results in an effect that the amount of heat generated in the center part C1, where heat tends to build up, is reduced and the heating temperature is easily made uniform between the inner portion and the outer portion of the center part C1.

In Modification 1, the temperatures of bent-back portions of the heater wire 3 such as those included in a region F1 tend to be higher. Therefore, the heater substrate 100 may have adjustment parts that are connected to the bent-back portions or connected near the bent-back portions and adjustment may be performed using the adjustment parts so as to reduce the temperatures of the bent-back portions. Since the bent-back portions in the center part C1 tend to have even higher temperatures, the heater substrate 100 may have adjustment parts that are connected to the bent-back portions of the center part C1 or connected near the bent-back portions and adjustment may be performed using the adjustment parts so as to reduce the temperatures of the bent-back portions of the center part C1.

(Modification 2)

A heater substrate 100 of Modification 2 (FIG. 4) includes an insulating substrate 1 having a rectangular substrate surface, a meandering-pattern heater wire 3, and a plurality of adjustment parts 5G to 5J located in a center part C1 of the substrate surface. The adjustment parts 5G to 5J are connected to the two ends of sections of the heater wire 3, which overlap the center part C1.

In the heater substrate 100 of Modification 2, the heater wire 3 having a meandering pattern allows uniform heat generation in each part of a rectangular region. In addition, by providing the adjustment parts 5G to 5J connected to the two ends of the sections of the heater wire 3 overlapping the center part C1, building up of heat in the center of the heating region can be reduced even in the rectangular heating region W1 and the heating temperature in the rectangular region can be made uniform.

Note that in the insulating substrate 1 of Modification 2, one or a plurality of adjustment parts may be located outside the center part C1, the plurality of adjustment parts may be disposed in a distributed manner in a longitudinal direction of the insulating substrate 1, and one adjustment part may be connected so as to short cut a meandering corner of the meandering pattern. In the meandering pattern, although the temperature tends to be higher in the bent-back portions of the heater wire 3 included in regions F2, the bent-back portions of the meandering pattern are located at the outer edge of the heating region W1 and therefore heat is readily dissipated. Therefore, the adjustment parts may be configured so as to be positioned in the center part C1.

(Modification 3)

A heater substrate 100 of Modification 3 (FIG. 5) includes an insulating substrate 1 having a rectangular substrate surface, heater wires 3a and 3b having a meandering pattern and divided into two pieces, and adjustment parts 5K and 5L located in a center part C1 of the substrate surface. A pair of power-feeding terminals 43, which are electrically connected to the two ends of one heater wire 3a, and a pair of power-feeding terminals 43, which are electrically connected to the two ends of the other heater wire 3b, are located on the second surface 12. The adjustment part 5K is connected to a partial section of the one heater wire 3a and the adjustment part 5L is connected to a partial section of the other heater wire 3b. Since the adjustment parts 5K and 5L are connected to the plurality of heater wires 3a and 3b, which are divided from each other and can carry different currents, it is possible to adjust the amounts of heat generated in the plurality of heater wires 3a and 3b by adjusting the resistances of the adjustment parts 5K and 5L.

(Modifications 4 to 10)

FIGS. 6 to 12 are plan views illustrating heater wire patterns of Modifications 4 to 10. FIGS. 6 to 12 illustrate a region between ceramic insulating layers 1a where heater wires 3A to 3M are disposed in an insulating substrate 1.

In Modification 4 (FIG. 6), a substrate surface of the insulating substrate 1 has an octagonal shape that is laterally and vertically symmetrical and a heater wire 3A has a spiral-shaped pattern, the two ends of which are located at an outer peripheral portion thereof.

In Modification 5 (FIG. 7), a substrate surface of an insulating substrate 1 has a square shape, and a heater wire 3B has a pattern having a plurality of concentric sections of different diameters, the plurality of sections being connected to each other so as to form a single continuous pattern. The connecting portions between the sections may be located within an angular range H1 in an upper part of the sheet of FIG. 7 from the center of the concentric circles or the connecting portions between the sections may be disposed in a distributed manner in a plurality of angular directions centered on the center of the concentric circles.

In Modification 6 (FIG. 8), a substrate surface of an insulating substrate 1 has a regular decagon shape, and a heater wire 3C has a pattern having a plurality of concentric sections of different diameters, the plurality of sections being connected to each other so as form a single continuous pattern. The connecting portions between the sections may be located within an angular range H2 in an upper part of the sheet in FIG. 8 or an angular range H3 in a lower part of the sheet in FIG. 8 from the center of the concentric circles, and both ends of the heater wire 3C may be located so as to be adjacent to each other in an outer peripheral portion of the heating region W1.

Modification 7 (FIG. 9) is an example in which a substrate surface of an insulating substrate 1 has a regular dodecagon shape and in which there are two heater wires 3D and 3E that have a spiral shape and are adjacent to each other from first ends to second ends thereof. End portions of the two heater wires 3D and 3E may be respectively disposed at the center and the outer peripheral portion of a heating region W1.

Modification 8 (FIG. 10) is an example in which a substrate surface of an insulating substrate 1 has a circular shape, one heater wire 3F is located in a circular region W2 at the center of a heating region W1, and another one heater wire 3G is located in a region W3 outside the region W2. The heater wire 3F has a pattern having a plurality of concentric sections of different diameters, the plurality of sections being connected to each other so as to form a single continuous pattern. The heater wire 3G has a pattern having a plurality of concentric sections of different diameters, the plurality of sections being connected to each other so as to form a single continuous pattern. Connecting portions between the plurality of sections of the heater wire 3F and connecting portions between the plurality of sections of the heater wire 3G may be positioned within ranges of the concentric sections that differ from each other by 180 degrees with respect to the center.

Modification 9 (FIG. 11) is an example in which a substrate surface of an insulating substrate 1 has a regular octagonal shape and one heater wire 3H is located in one region W4 and one heater wire 3I is located in another region W5, these regions being obtained when a heating region W1 is divided in two along a center line. The heater wire 3H has a pattern having a plurality of concentric semicircular sections of different diameters, the plurality of sections being connected to each other so as to form a single continuous pattern. The heater wire 3I may have the same pattern as the heater wire 3H or may have a pattern that is symmetrical about a boundary line between the regions W4 and W5.

Modification 10 (FIG. 12) is an example in which a substrate surface of an insulating substrate 1 and a heating region W1 have polygonal shapes having 90 degree rotational symmetry and in which heater wires 3J to 3M are each located in one of regions W6 to W9, which are obtained when the heating region W1 is divided into four pieces having center angles of 90 degrees. The heater wire 3J has a pattern including a plurality of sections that are at different distances from the center of the heating region W1 and extend parallel to the edges of the heating region W1, and are bent at positions corresponding to corners of the heating region W1, the plurality of sections being connected to each other so as to form a single continuous pattern. Furthermore, the heater wire 3J may include a straight section that extends from the center to an outer peripheral portion of the heating region W1 and one end of heater wire 3J may be positioned at the outer peripheral portion using the straight section. The straight section is positioned so as to cross the boundary between the regions W6 and W7, which are adjacent to each other. Both ends of the heater wire 3J can be disposed at the outer peripheral portion of the heating region W1 by providing such a straight section. The patterns of the heater wires 3K to 3M may be configured similarly to the pattern of the heater wire 3J.

Figure 8:
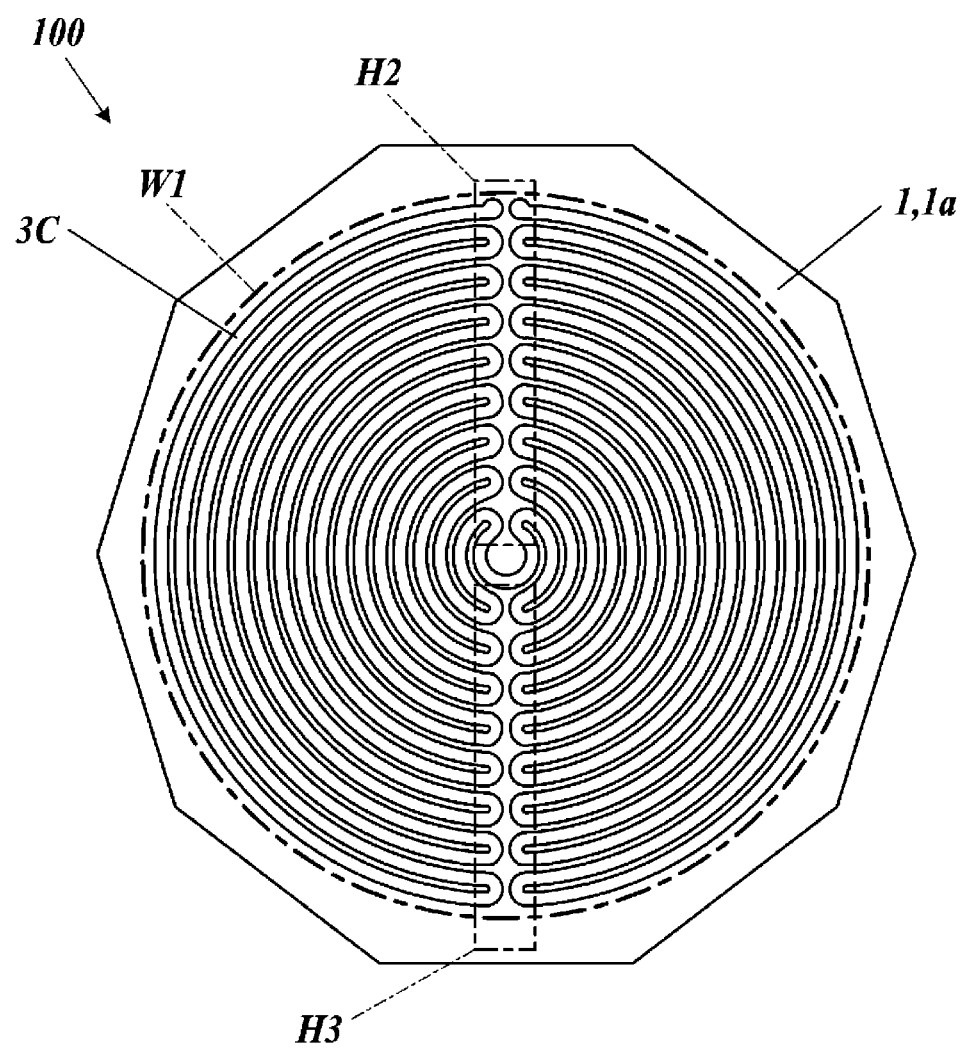
FIG. 8 is a plan view illustrating a heater wire pattern of Modification 6.
Figure 9:
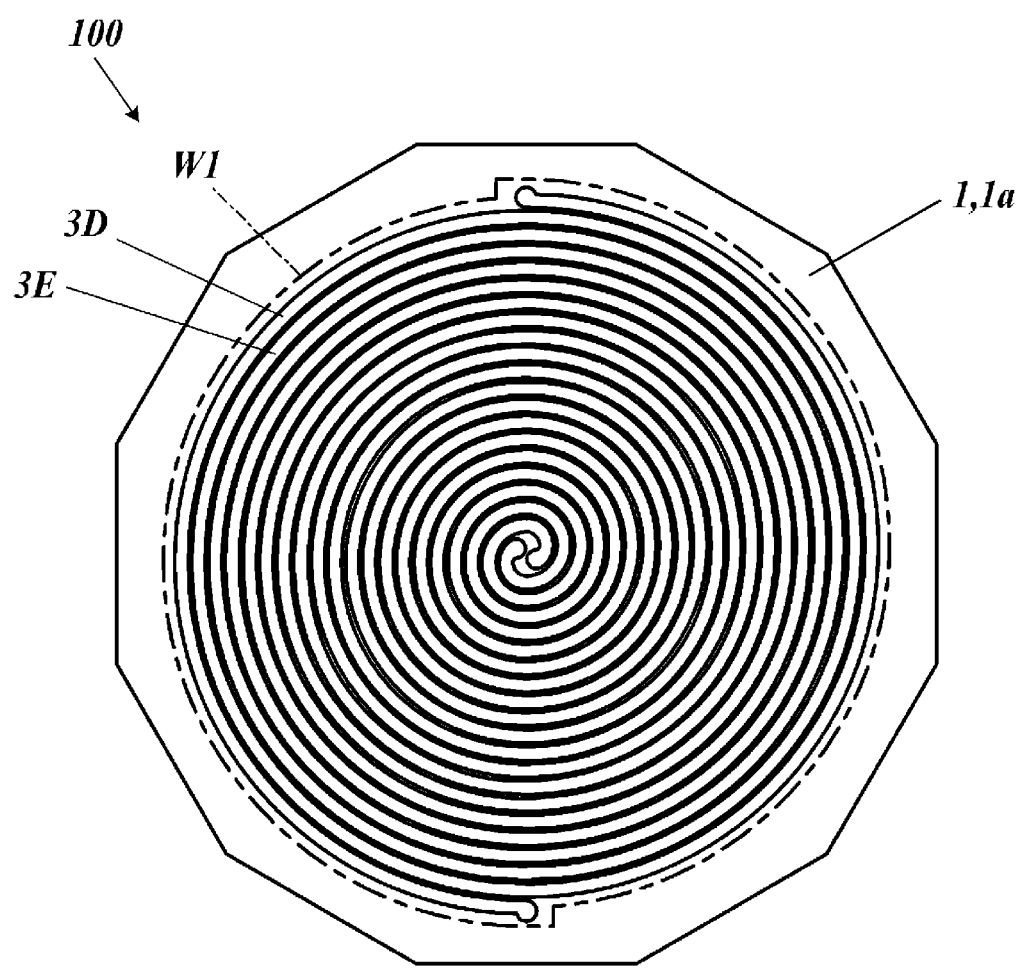
FIG. 9 is a plan view illustrating a heater wire pattern of Modification 7.
Figure 10:
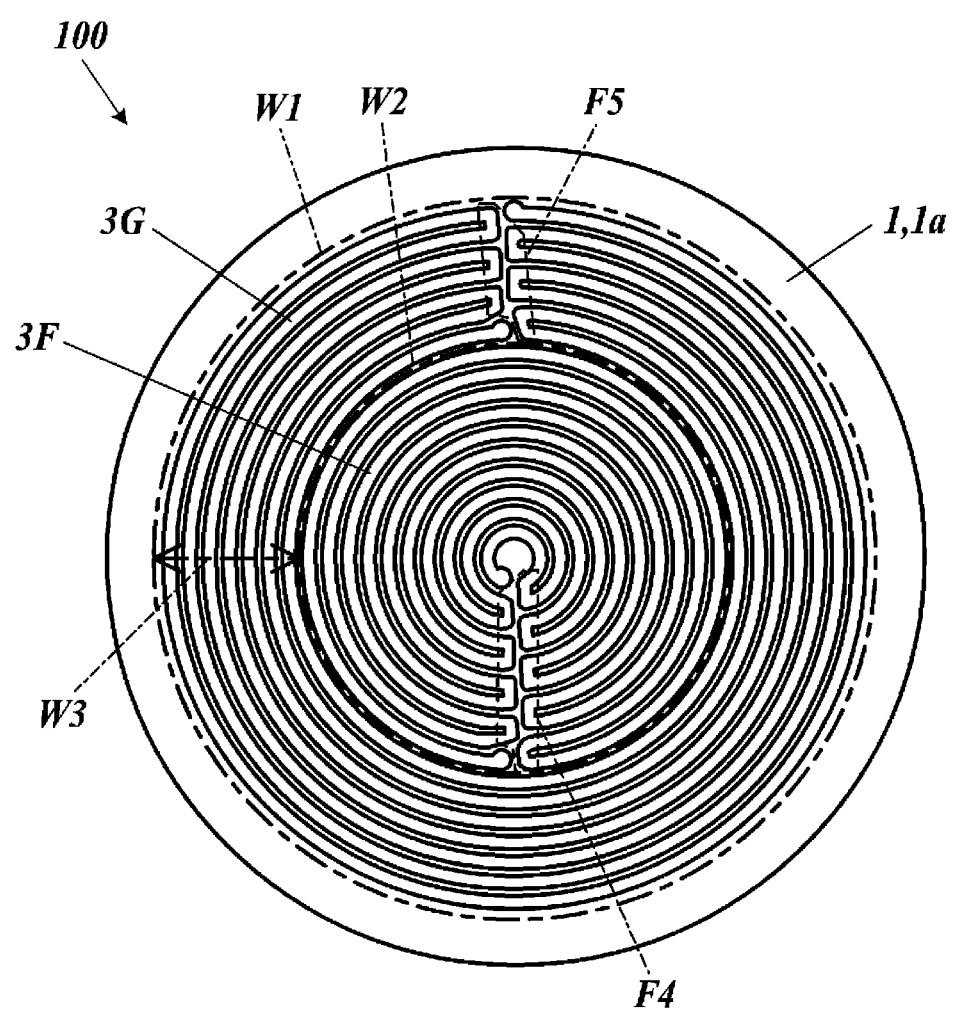
FIG. 10 is a plan view illustrating a heater wire pattern of Modification 8.
Figure 11:
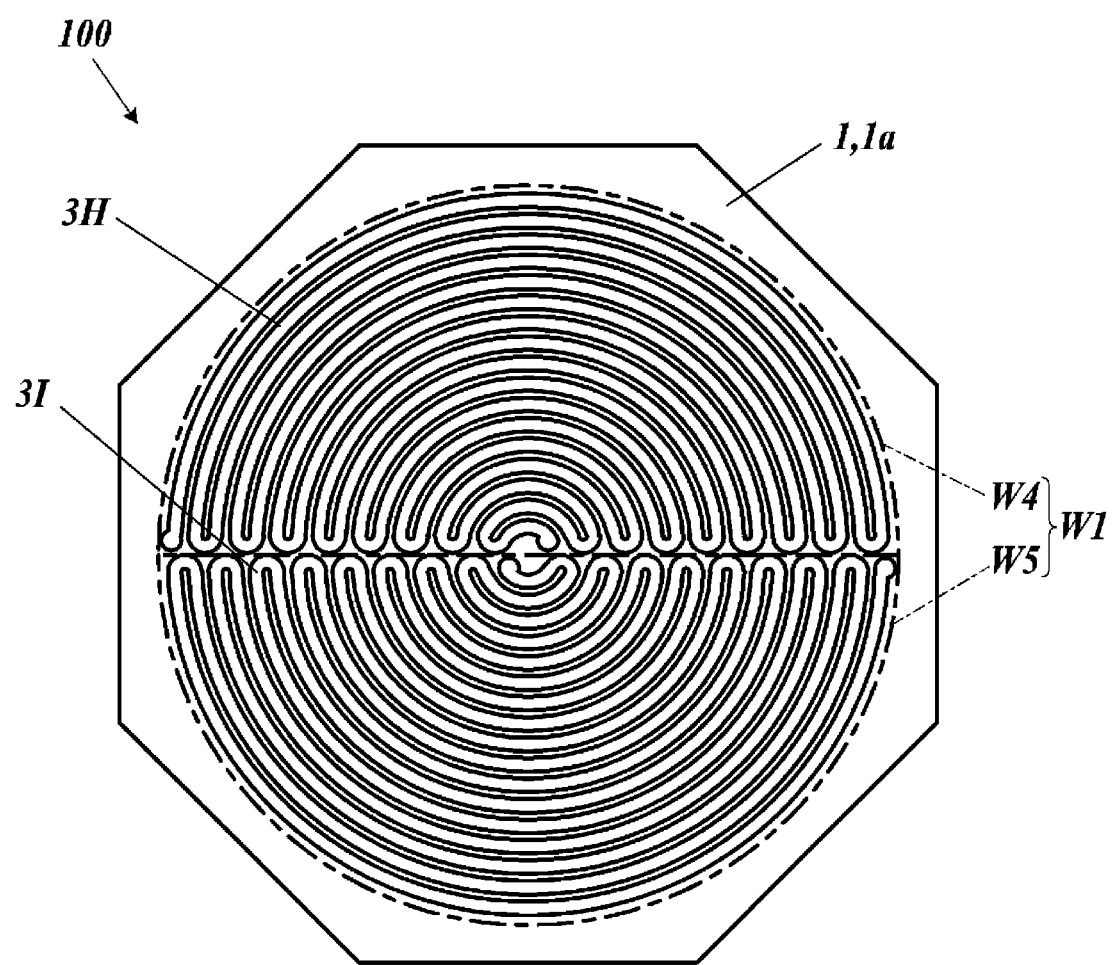
FIG. 11 is a plan view illustrating a heater wire pattern of Modification 9.
Figure 12:
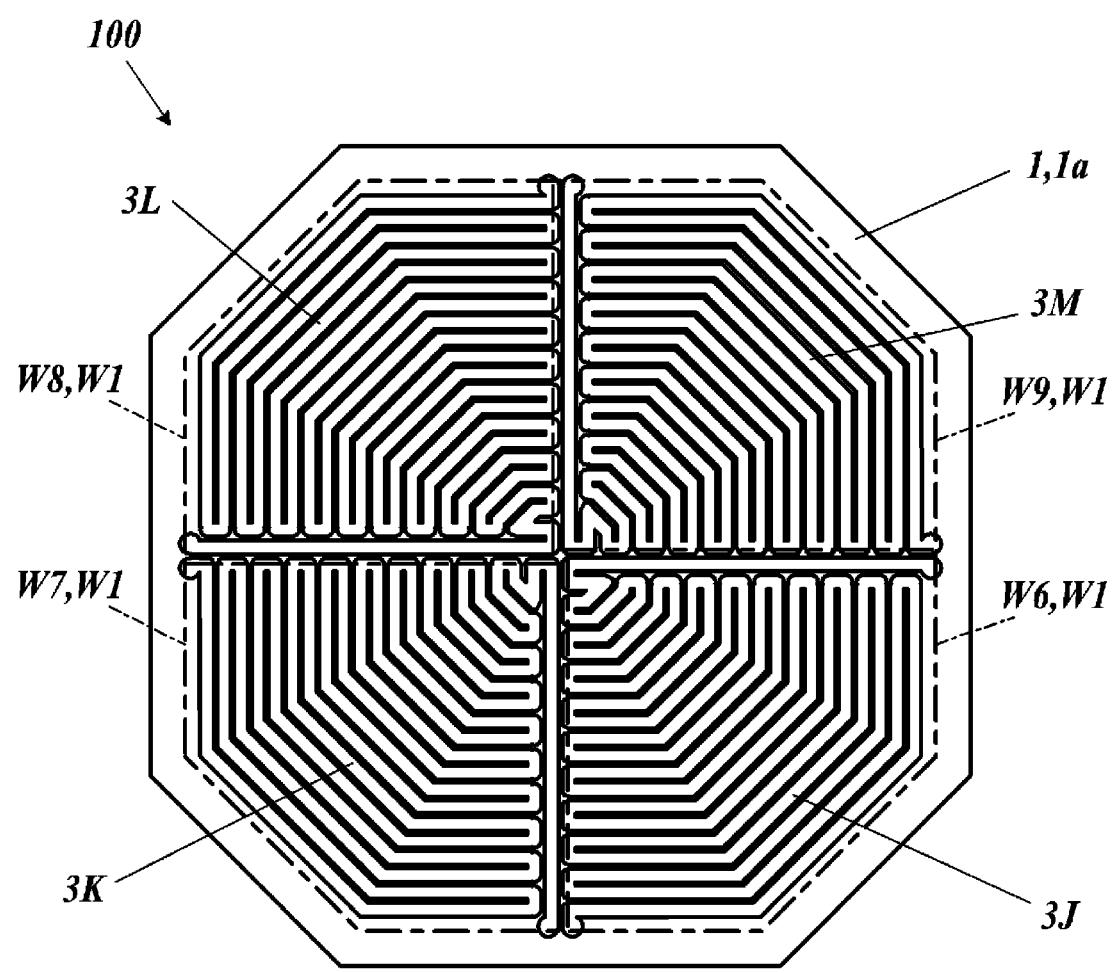
FIG. 12 is a plan view illustrating a heater wire pattern of Modification 10.

In a heater substrate according to the present disclosure, various shapes and patterns can be used for the shape of the insulating substrate and the pattern of the heater wire, as illustrated in Embodiments 4 to 10. The temperature tends to be higher in the bent-back portions of the heater wire 3A included in the region F3 in Modification 4 (FIG. 6), the bent-back portions (connecting portions between sections) of the heater wire 3B included in the angular range H1 in Modification 5 (FIG. 7), and the bent-back portions (connecting portions between sections) of the heater wire 3C included in the angular ranges H2 and H3 in Modification 6 (FIG. 8). Furthermore, the temperature tends to be higher in the bent-back portions (connecting portions between sections) of the heater wires 3F and 3G included in the regions F4 and F5 in Modification 8 (FIG. 10), the bent-back portions (connecting portions between sections) located at a boundary part between the regions W4 and W5 in Modification 9 (FIG. 11), and the bent-back portions (connecting portions between sections) of the heater wires 3J to 3M in Modification 10 (FIG. 12). Therefore, the heater substrate 100 may have adjustment parts that are connected to the bent-back portions or connected near the bent-back portions and adjustment may be performed using the adjustment parts in order to reduce the temperatures of the bent-back portions. Since the bent-back portions in the center part tend to have even higher temperatures, the heater substrate 100 may have adjustment parts that are connected to the bent-back portions of the center part or connected near the bent-back portions and adjustment may be performed using the adjustment parts in order to reduce the temperatures of the bent-back portions in the center part. Spiral heater wires, such as the heater wires 3, 3A, 3E, and 3D of Embodiment 1, Embodiment 2, Modification 4 (FIG. 6), and Modification 7 (FIG. 9), include no or few bent-back portions where the temperature tends to become high, which is an advantage in terms of heat uniformity. Furthermore, if there are heater wires outside the region facing the object to be heated (for example, wafer SW), the heater substrate may have adjustment parts connected to the heater wires in this part. Adjusting the amount of heat generated using the adjustment parts can reduce the effect on heat uniformity for the object to be heated.

Embodiment 3

Figure 13A:
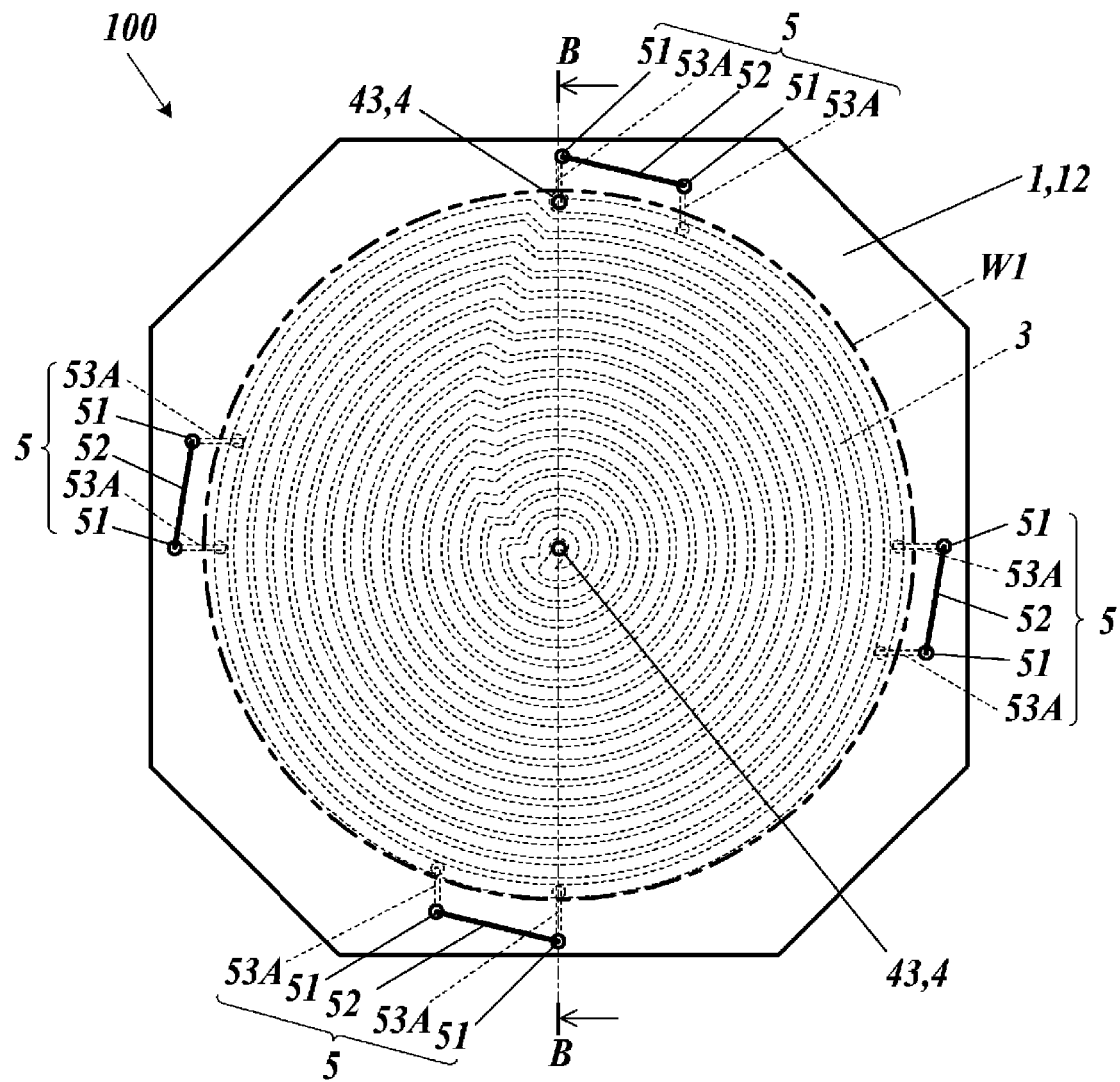
FIG. 13A is a plan view from a second surface side of a heater substrate according to Embodiment 3 of the present disclosure.
Figure 13B:
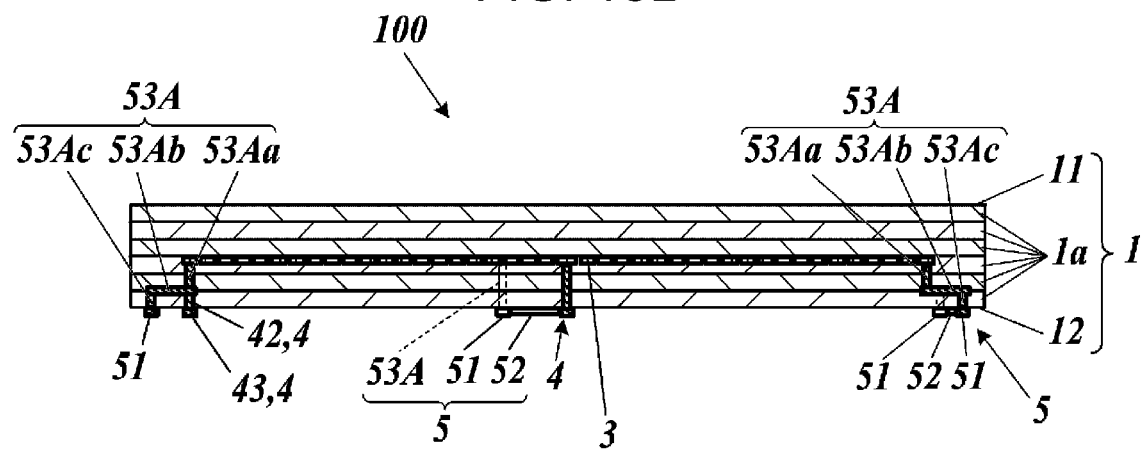
FIG. 13B is a sectional view taken along line B-B in FIG. 13A.

FIG. 13A is a plan view from a second surface side of a heater substrate according to Embodiment 3 of the present disclosure. FIG. 13B illustrates a sectional view taken along line B-B in FIG. 13A. A heater substrate 100 of Embodiment 3 differs from Embodiment 1 in terms of the structure of inner conductors 53A of adjustment parts 5 and the arrangements of adjustment terminals 51 and adjustment conductors 52, and the rest of the constituent elements are the same as in Embodiment 1. The different constituent elements will be described in detail below.

Each adjustment part 5 includes a pair of inner conductors 53A connected to both ends of a partial section of a heater wire 3, a pair of adjustment terminals 51 located on the second surface 12 and respectively connected to the pair of inner conductors 53A, and an adjustment conductor 52 connected to the pair of adjustment terminals 51. Each inner conductor 53A includes a first inner conductor 53Aa and a third inner conductor 53Ac that extend in a direction perpendicular to a substrate surface of an insulating substrate 1 and a second inner conductor 53Ab that extends in a direction along the substrate surface of the insulating substrate 1. The first inner conductor 53Aa is connected to the heater wire 3 and the second inner conductor 53Ab and conducts heat between the heater wire 3 and the second inner conductor 53Ab. The third inner conductor 53Ac is connected to the second inner conductor 53Ab and the adjustment terminal 51 and conducts heat between the second inner conductor 53Ab and the adjustment terminal 51. The second inner conductor 53Ab is located at an interlayer (between a pair of adjacent ceramic insulating layers 1a) provided between an interlayer of the insulating substrate 1 where the heater wire 3 is disposed (between pair of adjacent ceramic insulating layers 1a) and the second surface 12. The second inner conductor 53Ab extends from an outer peripheral portion of the heater wire 3 to outside the heating region W1 when viewed in a see-through manner in a direction perpendicular to the substrate surface of the insulating substrate 1. The heating region W1 corresponds to an arrangement region of the heater wire 3. The heating region W1 may include a region that faces an object that is to be heated and may be larger than that region. For example, in the case where the heater substrate 100 is applied to a probe card 700, the heating region W1 may include a region that faces a wafer SW, which is the object to be heated, and the heating region W1 may be larger than the region facing the wafer SW (refer to FIG. 14A). The third inner conductors 53Ac are connected to parts of the second inner conductors 53Ab outside the heating region W1 and the adjustment terminals 51 and the adjustment conductors 52 are located outside the heating region W1 (refer to FIG. 13A).

In contrast to Embodiment 1, the adjustment conductors 52 can be disposed in a peripheral portion of the second surface 12 in the heater substrate 100 of Embodiment 3. This is useful when there are numerous other constituent elements disposed at the center of the second surface 12 or in the heating region W1 and it is difficult to secure spaces in which to dispose the adjustment conductors 52. In addition, the heating region W1 may be larger than the region facing the object to be heated and an outer peripheral portion of the heating region W1 may protrude beyond the region facing the object to be heated. The outer peripheral portion of the heating region W1 has good heat dissipation characteristics and therefore tends to be at a lower temperature, and even if the temperature is further reduced by the adjustment parts, there is an advantage that the outer peripheral portion tends not to affect the heat uniformity for the object to be heated so long as the object to be heated does not face the outer peripheral portion.

(Probe Card Substrate)

Figure 14A:
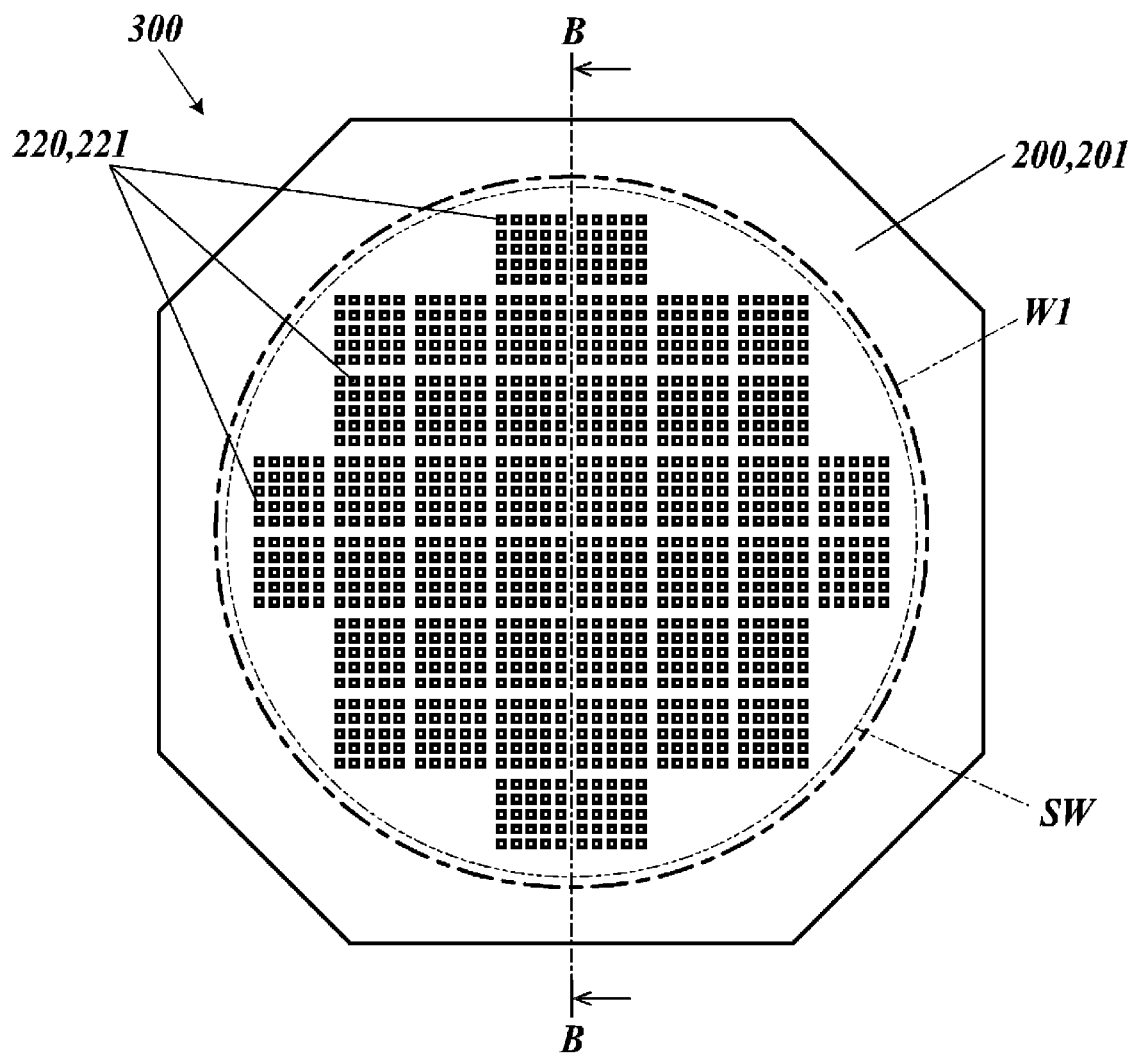
FIG. 14A is a plan view illustrating a probe card of an embodiment of the present disclosure.
Figure 14B:
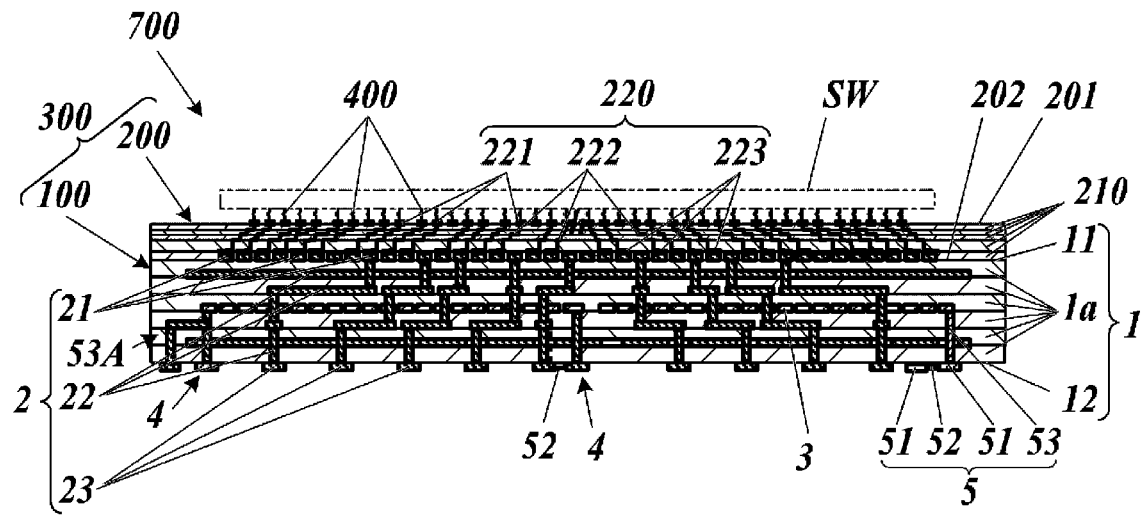
FIG. 14B is a sectional view taken along line B-B in FIG. 14A.
Figure 15:
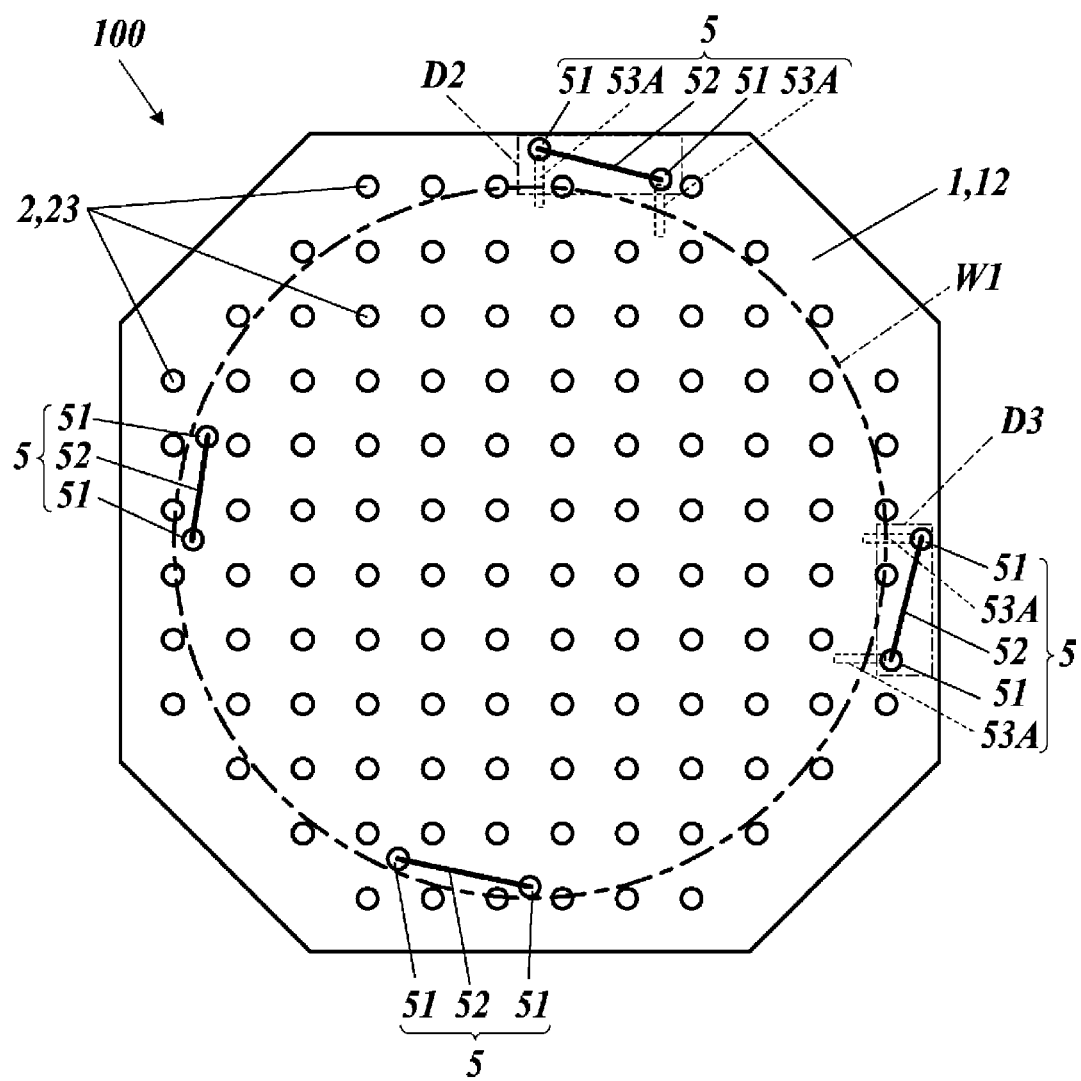
FIG. 15 is a plan view from a second surface side of a probe card substrate of an embodiment of the present disclosure.
Figure 16:
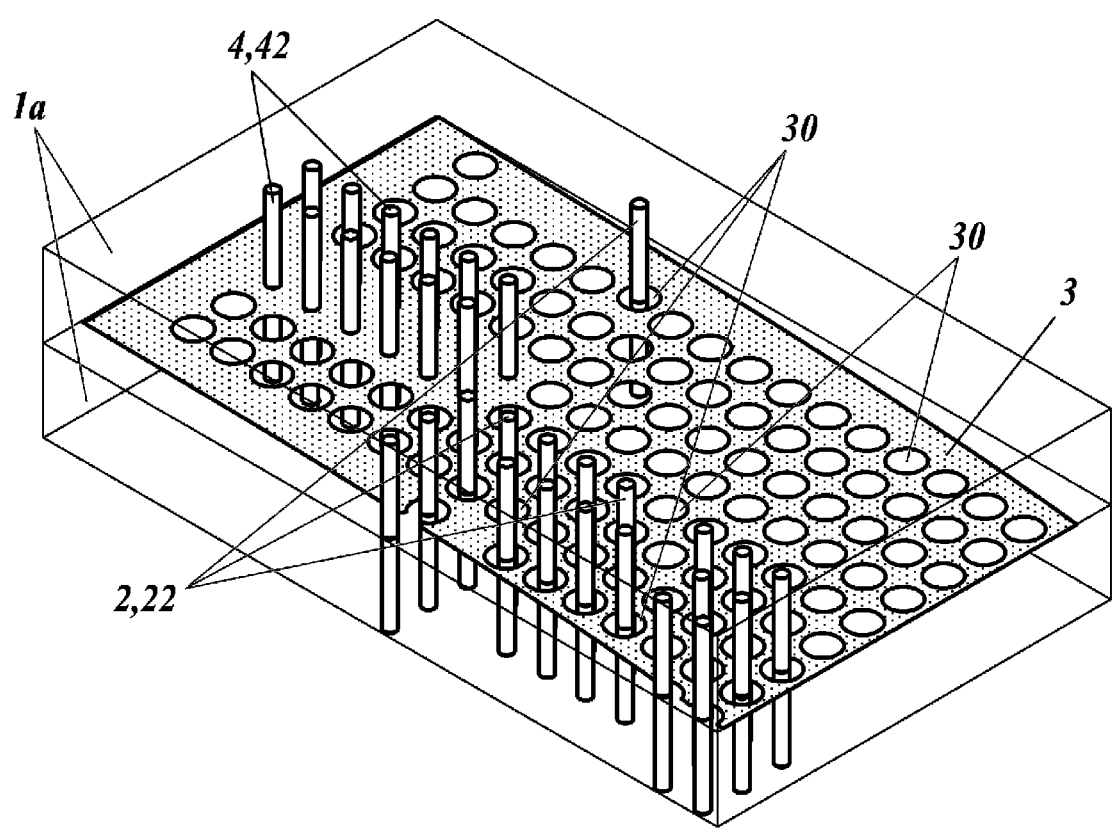
FIG. 16 is a diagram illustrating an example of a structure in which a heater wire and circuit conductors intersect each other.

FIG. 14A is a plan view illustrating a probe card of an embodiment of the present disclosure. FIG. 14B is a sectional view taken along line B-B in FIG. 14A. FIG. 15 is a plan view from a second surface side of a probe card substrate of an embodiment of the present disclosure. FIG. 16 is a diagram illustrating an example of a structure in which a heater wire and circuit conductors intersect each other.

A probe card 700 of an embodiment of the present disclosure is a component incorporated into a device for testing a plurality of semiconductor elements on a wafer SW, and sends a signal or voltage to a semiconductor element and receives a signal or voltage back from the semiconductor element while probe pins 400 are in contact with terminals of the semiconductor element. The probe card 700 includes a probe card substrate 300 and probe pins 400 that are fixed to the probe card substrate 300. The probe card substrate 300 includes the heater substrate 100 and a circuit substrate 200 located on the first surface 11 of the heater substrate 100.

In addition to the configurations described in any of Embodiments 1 to 3, the heater substrate 100 includes a plurality of first circuit conductors 2 that are positioned so as to extend from the first surface 11 and the second surface 12 and are insulated from the heater wire 3. Each first circuit conductor 2 includes a bonding conductor 21 located on the first surface 11, an inner conductor 22 located inside the insulating substrate 1, and an outer terminal 23 located on the second surface 12. The inner conductor 22 has one end connected to the bonding conductor 21 and the other end connected to the outer terminal 23, and electrically connects the outer terminal 23 and the bonding conductor 21 to each other. The inner conductor 22 may include a part that extends in a direction perpendicular to a substrate surface of the heater substrate 100 and a part that extends in a direction along the substrate surface. As illustrated in FIG. 16, the heater wire 3 includes through holes 30. The inner conductors 22, which are disposed at positions intersecting the heater wire 3, extend through the through holes 30 of the heater wire 3, are insulated from the heater wire 3, and extend from the first surface 11 to the second surface 12 while crossing the heater wire 3. The inner conductors 22, which are each depicted as a single conductor in FIG. 14B, may each consist of a bundle of a plurality of inner conductors 22 as illustrated in FIG. 16. For each of the inner conductors 42 that supply power to the heater wire 3, the parts depicted as single conductors in FIG. 1B may also consist of a bundle consisting of a plurality of inner conductors 42. The same applies to the inner conductors 53 of the adjustment parts 5 connected to the heater wire 3.

As illustrated in FIG. 15, the plurality of outer terminals 23 of the first circuit conductors 2 are arrayed across the second surface 12 of the heater substrate 100. The plurality of outer terminal 23 are disposed so as to be spaced apart from the adjustment terminals 51 and the adjustment conductors 52. The plurality of outer terminals 23 are positioned so as to avoid a peripheral portion of the second surface 12. In this configuration, positioning the adjustment terminals 51 and the adjustment conductors 52 in a peripheral portion of the second surface 12, as indicated by regions D2 and D3, is advantageous since a situation in which the space in which the outer terminals 23 are disposed is reduced by the adjustment terminals 51 and the adjustment conductors 52 can be avoided.

The circuit substrate 200 includes a plurality of stacked resin insulating layers 210 and second circuit conductors 220. The second circuit conductors 220 include a plurality of bonding conductors 221 located on a third surface 201 of the circuit substrate 200, a plurality of bonding conductors 223 located on a fourth surface 202, which is on the opposite side from the third surface 201, and a plurality of inner conductors 222 that are positioned so as to extend from the third surface 201 to the fourth surface 202 inside the circuit substrate 200 and electrically connect the plurality of bonding conductors 221 and the plurality of bonding conductors 223 to each other.

The plurality of bonding conductors 221 are disposed so as to correspond to terminals of semiconductor elements on the wafer SW and the probe pins 400 are bonded thereto. The plurality of bonding conductors 223 are disposed so as to correspond to the plurality of bonding conductors 21 of the heater substrate 100 and are connected to the plurality of bonding conductors 21.

According to the probe card 700 including the heater substrate 100, the heater substrate 100, the circuit substrate 200 and the wafer SW, which is the object to be tested, can be heated by causing the heater wire 3 to generate heat. Furthermore, the amount of heat generated by the heater wire 3 is adjusted using the adjustment parts 5 of the heater substrate 100 in order to reduce lot-to-lot or individual variations, or variations between individual parts within the heating region. Alternatively, the amounts of heat generated in a plurality of parts within the heating region W1 are adjusted using the adjustment parts 5 so as to be brought close to desired values. Therefore, the wafer SW can be tested under highly precise temperature conditions.

Example of Manufacturing Method

The ceramic insulating layers 1a of the insulating substrate 1 are composed of a sintered ceramic such as sintered aluminum oxide, sintered aluminum nitride, sintered silicon carbide, sintered mullite, or a glass ceramic. Sintered mullite and some glass ceramics have a lower coefficient of thermal expansion than the other ceramic sintered materials listed above, and have a coefficient of thermal expansion close to that of silicon, which is the base material of the wafer SW that is the object to be tested. Therefore, when the heater substrate 100 is used in the probe card 700 in order to perform testing, it is unlikely that positional deviations will occur between the electrodes on the wafer SW and the probe pins 400 due to the temperature of the environment when performing the testing. Therefore, the probe card 700, which is excellent in terms of testing accuracy, can be provided. When sintered aluminum oxide, sintered aluminum nitride, or sintered silicon carbide is used, the substrate will have higher rigidity and be able to better conduct the heat generated by the heater wire 3 to the wafer SW since these sintered ceramics are stronger and have a higher thermal conductivity than sintered mullite or a glass ceramic.

If the insulating substrate 1 is composed of sintered aluminum oxide, for example, the insulating substrate 1 can be manufactured in the following way. First, a raw material powder mainly consisting of aluminum oxide powder and a powder such as silicon oxide serving as a sintering aid component are mixed together with an organic solvent and a binder in order to form a slurry, the slurry is then formed into sheets using a molding method such as a doctor blade method or a lip coater method in order to produce ceramic green sheets (hereinafter referred to as "green sheets") that will become the ceramic insulating layers 1a. Next, a plurality of green sheets are stacked in order to form a multilayer body. After that, the insulating substrate 1 can be produced by firing the multilayer body at a temperature of around 1300° C. to 1600° C.

The first circuit conductors 2 include, for example, a metallic material such as tungsten, molybdenum, manganese or copper, or an alloy material of these metallic materials as a conductor component. For example, these metallic materials (alloy materials) are sintered simultaneously with the firing of the ceramic green sheets so as to form metalized conductors on the surfaces of and inside the insulating substrate 1. For example, inorganic components such as glass or a ceramic may also be included in order to improve sintering or increase the strength of bonds with a ceramic material.

When the bonding conductors 21, the inner conductor layers (parts extending in direction along substrate surface) of the inner conductor 22, and the outer terminals 23 of the first circuit conductors 2 are, for example, tungsten metalized layers, the layers can be formed in the following way. For example, the layers can be formed by printing a metal paste prepared by mixing tungsten powder with an organic solvent and an organic binder at predetermined positions on the above-mentioned green sheets that will become the ceramic insulating layers 1a using a screen printing method or the like and then firing the printed metal paste together with the green sheets. The via conductors (the parts extending in a direction perpendicular to the substrate surface) of the inner conductors 22 can be formed by forming through holes at predetermined positions in the green sheets prior to printing the above-described metal paste and filling the through holes with the same metal paste described above.

A nickel film of around 1 to 10 μm and a gold film of around 0.1 to 3 μm can be formed in this order on the exposed surfaces of conductor layers such as the bonding conductors 21 and the outer terminals 23 in order to protect the surfaces and improve the bonding properties of brazing materials, solder, and the like. The nickel films and the gold films can be formed as plating films using electrolytic plating or as thin films.

The bonding conductors 21 can also be formed of metalized conductors as described above, and can also be formed of thin film conductor wiring layers. Thin film conductor wiring layers can be fabricated in the following way, for example. For example, using a thin film forming method such as a sputtering method, first, a bonding metal layer of around 0.1 to 3 μm composed of titanium, chrome, or the like is formed over the entire first surface 11 of the insulating substrate 1 having the inner conductors 22 and the outer terminals 23 formed of metalized conductors. Next, a conductive thin film layer is formed by forming a main conductor layer of around 2 to 10 μm composed of copper or the like over the entire surface of this bonding metal layer. Barrier layers and so forth may also be formed as necessary. The thin film bonding conductors 21 can then be formed by patterning the conductive thin film layer using photolithography.

The first surface 11 of the insulating substrate 1 can be planarized by performing polishing or the like prior to forming the thin film bonding conductors 21 thereon. Thus, the thin film bonding conductors 21 can be formed with high precision.

The heater wire 3 and the power-feeding terminals 43 of the power-feeding conductors 4 can be formed of metalized layers using the same materials and method as used for the adjustment terminals 51 and the second inner conductor 53Ab of the adjustment parts 5, and the bonding conductors 21, the inner conductor layers of the inner conductors 22, and the outer terminals 23 of the first circuit conductors 2. A metal paste obtained by adding a high-resistance component such as ceramic particles to the metal paste used for the first circuit conductors 2 can also be used as a metal paste for heater wire 3. The through holes 30 in the heater wire 3 can be set using the screen pattern when performing screen printing on the green sheets. The inner conductors 42 of the power-feeding conductors 4 and the inner conductors 53, the first inner conductors 53Aa, and the third inner conductors 53Ac of the adjustment parts 5 can be formed using the same materials and method as those used for the via conductors of the inner conductors 22.

The circuit substrate 200 includes the plurality of stacked resin insulating layers 210 (resin insulating substrate) as described above. The number and thickness of the resin insulating layers 210 are set in accordance with the number of electrodes of the semiconductor elements that are to be tested and so forth and are set so as to be able to be connected to the first circuit conductors 2 (bonding conductors 21) of the heater substrate 100 and used.

The resin insulating layer 210 is, for example, composed of an insulating resin such as polyimide resin, polyamide-imide resin, siloxane modified polyamideimide resin, siloxane modified polyimide resin, polyphenylene sulfide resin, fully aromatic polyester resin, benzocyclobutene (BCB) resin, epoxy resin, bismaleimide triazine resin, polyphenylene ether resin, polyquinoline resin, or fluororesin.

The resin insulating layers 210 may contain a filler in order to adjust moldability and the coefficient of thermal expansion. Examples of inorganic fillers include barium sulfate, barium titanate, amorphous silica, crystalline silica, fused silica, spherical silica, talc, clay, magnesium carbonate, calcium carbonate, aluminum oxide, aluminum hydroxide, silicon nitride, aluminum nitride, boron nitride, alumina, magnesium oxide, magnesium hydroxide, titanium oxide, mica, talc, neiburg silica earth, organic bentonite, zirconium phosphate, and so on. One of these materials may be used by itself or two or more of these materials may be used in combination with each other as appropriate.

A resin-insulating substrate can be manufactured, for example, using a method in which a plurality of film-like resin-insulating layers 210 are stacked and bonded together or using a method in which a process in which a resin-insulating layer 210 is formed by applying and curing a liquid precursor resin and then forming another resin-insulating layer 210 using the liquid precursor resin on top of the first resin insulating layer 210 is repeatedly performed. The method in which film-like resin insulating layers 210 are stacked on top of one another is more efficient.

The bonding conductors 221 and 223 and the inner conductors 222 of the second circuit conductors 220 may be formed in the following way, for example. First, resist films having openings corresponding to the via conductors (the parts extending perpendicular to the substrate surface) and the thin-film wiring layers (the parts extending along the substrate surface) of the inner conductors 222 are formed on the resin layers that will become the resin insulating layers 210, and then recesses corresponding to the thin-film wiring layers and through-holes corresponding to the via conductors are formed by etching or laser processing. Although the recesses corresponding to the thin-film wiring layers are not necessarily required, the reliability of the bonds between the thin-film wiring layers and the resin insulating layers 210 can be improved by providing the recesses. Next, base conductor layers composed of, for example, chromium (Cr)-copper (Cu) alloy layers or titanium (Ti)-copper (Cu) alloy layers are formed inside the recesses and through holes of the resin insulation layers 210 using a thin film forming method such as vapor deposition, sputtering, or ion plating. After that, the inner conductors 222 can be formed by filling the recesses and through holes with a metal having a low electrical resistance such as copper or gold by performing plating or the like and then stripping off the resist.

A nickel film of around 1 to 10 µm and a gold film of around 0.1 to 3 µm can be formed in this order on the surfaces of the bonding conductors 221 of the second circuit conductors 220 in order to protect the surfaces of the bonding conductors 221 and improve the bonding properties of brazing materials, solder, and the like. The nickel films and the gold films can be formed as plating films using electrolytic plating or as thin films.

As a method for forming the heater substrate 100 and the circuit substrate 200 into a multilayer structure, for example, there is a method in which the circuit substrate 200 is manufactured and then bonded to the upper surface (first surface 11) of the heater substrate 100 and a method in which the resin insulating layers 210 are stacked on the upper surface (first surface 11) of the heater substrate 100 one layer at a time. The method in which the resin insulating layers 210 are stacked one layer at a time may be a method in which a film-like resin is used or a method in which a liquid precursor resin is used as described above. The method in which the circuit substrate 200 is manufactured and the plurality of resin insulating layers 210 (and second circuit conductors 220) are bonded to the upper surface (first surface 11) of the heater substrate 100 in one go is more efficient.

The probe card 700 is formed by attaching the probe pins 400 to the second circuit conductors 220 (bonding conductors 221) of the thus-formed probe card substrate 300. The probe pins 400 are mechanically bonded to and electrically connected to the bonding conductors 221.

The probe pins 400 are, for example, composed of a metal such as nickel or tungsten. If the probe pins 400 are composed of nickel, for example, the probe pins 400 are manufactured in the following way. First, a female mold of a plurality of probe pins is formed by etching one surface of a silicon substrate. The female mold is disposed so as to correspond to the arrangement of the bonding conductors 221 of the probe card substrate 300. Next, the surface of the silicon substrate in which the female mold has been formed is coated with a metal consisting of nickel using a plating method, and then the female mold is further filled with nickel. The nickel adhering to the upper surface of the silicon substrate, other than the nickel filling the female mold, is removed using an etching method or the like so as to form a silicon substrate having nickel probe pins embedded therein. The nickel probe pins embedded in the silicon substrate are bonded to the bonding conductors 221 of the probe card substrate 300 using a conductive bonding material such as solder. The probe card 700 in which the probe pins 400 are bonded to the bonding conductors 221 of the probe card substrate 300 is then obtained by removing the silicon substrate using a potassium hydroxide solution.

Embodiments of the present disclosure have been described above. However, a heater substrate, a probe card substrate, and a probe card of the present disclosure are not limited to the above-described embodiments. For example, in the above embodiments, an example is described in which a heater substrate is applied to a probe card substrate, but a heater substrate may be applied to various other substrates for which heating is required. Furthermore, the number and arrangement of the adjustment parts, the sections of the heater wire to which the adjustment parts are connected, and the adjustment conductor patterns described in the above embodiments are merely examples and can be modified in various ways. The adjustment conductor patterns may be similar to or different from the patterns of the sections of heater wire to which the adjustment parts are connected. Other details described in the embodiments can be changed as appropriate so long as the changes are within the spirit of the invention.

INDUSTRIAL APPLICABILITY

The present disclosure can be used for a heater substrate, a probe card substrate, and a probe card.

REFERENCE SIGNS LIST 1 insulating substrate
1a ceramic insulating layer
2 first circuit conductor
3, 3A to 3M heater wire 4 power-feeding conductor
11 first surface
12 second surface
21 bonding conductor
22 inner conductor
23 outer terminal
30 through hole
42 inner conductor
43 power-feeding terminal
5, 5A to 5L adjustment part
51 adjustment terminal
52 adjustment conductor
53, 53A inner conductor
53Aa first inner conductor
53Ab second inner conductor
53Ac third inner conductor
100 heater substrate
200 circuit substrate
201 third surface
202 fourth surface
210 resin insulating layer
220 second circuit conductor
221, 223 bonding conductor
222 inner conductor
300 probe card substrate
400 probe pin
700 probe card
C1 center part
SC1 to SC4 section
SW wafer
W1 heating region (arrangement region)

The invention claimed is:

1. A heater substrate comprising:
an insulating substrate having a first surface and a second surface that is on an opposite side from the first surface;
a heater wire located inside the insulating substrate; and
an adjustment part that is electrically connected to the heater wire,
wherein the adjustment part includes an adjustment conductor,
wherein the adjustment part includes a pair of adjustment terminals that are located on the second surface and are respectively electrically connected to two ends of a partial section of the heater wire, and
the adjustment conductor is located on the second surface and is connected to the pair of adjustment terminals,
wherein a plurality of the adjustment parts are provided, and
the plurality of adjustment parts are disposed in a distributed manner across the second surface,
wherein the adjustment part includes inner conductors that electrically connect the adjustment terminals and the heater wire to each other, and
the inner conductors include a first inner conductor that extends in a direction perpendicular to the first surface and a second inner conductor that extends in a direction along a substrate surface of the insulating substrate.

2. The heater substrate according to claim 1, wherein the one or plurality adjustment parts include an adjustment part located in a center part of the second surface.

3. The heater substrate according to claim 1, wherein the second inner conductor extends from a peripheral portion of an arrangement region of the heater wire to outside the arrangement region when viewed in a see-through manner in a direction perpendicular to the first surface.

4. The heater substrate according to claim 1, wherein the one or plurality adjustment parts include an adjustment part located in a center part of the second surface, and
wherein the second inner conductor extends from a peripheral portion of an arrangement region of the heater wire to outside the arrangement region when viewed in a see-through manner in a direction perpendicular to the first surface.

5. The heater substrate according to claim 1, wherein a specific resistance of the adjustment conductor and a specific resistance of the heater wire are different from each other.

6. A heater substrate comprising:
an insulating substrate having a first surface and a second surface that is on an opposite side from the first surface;
a heater wire located inside the insulating substrate; and
an adjustment part that is electrically connected to the heater wire,
wherein the adjustment part includes an adjustment conductor,
wherein the one or plurality adjustment parts include an adjustment part located in a center part of the second surface,
wherein the adjustment part includes inner conductors that electrically connect a pair of adjustment terminals and the heater wire to each other, and
the inner conductors include a first inner conductor that extends in a direction perpendicular to the first surface and a second inner conductor that extends in a direction along a substrate surface of the insulating substrate.

7. The heater substrate according to claim 6, wherein the adjustment part includes the pair of adjustment terminals that are located on the second surface and are respectively electrically connected to two ends of a partial section of the heater wire, and
the adjustment conductor is located on the second surface and is connected to the pair of adjustment terminals.

8. The heater substrate according to claim 6, wherein a plurality of the adjustment parts are provided, and
the plurality of adjustment parts are disposed in a distributed manner across the second surface.

9. The heater substrate according to claim 6, wherein the adjustment part includes inner conductors that electrically connect the adjustment terminals and the heater wire to each other, and
the inner conductors include a first inner conductor that extends in a direction perpendicular to the first surface and a second inner conductor that extends in a direction along a substrate surface of the insulating substrate, and
wherein the second inner conductor extends from a peripheral portion of an arrangement region of the heater wire to outside the arrangement region when viewed in a see-through manner in a direction perpendicular to the first surface.

10. The heater substrate according to claim 6, wherein a specific resistance of the adjustment conductor and a specific resistance of the heater wire are different from each other.

11. A probe card substrate comprising:
a heater substrate comprising:
an insulating substrate having a first surface and a second surface that is on an opposite side from the first surface;
a heater wire located inside the insulating substrate; and an adjustment part that is electrically connected to the heater wire,
wherein the adjustment part includes an adjustment conductor,
a plurality of first circuit conductors located from the first surface to the second surface and insulated from the heater wire, and
a circuit substrate located on the first surface of the heater substrate and including a plurality of second circuit conductors,
wherein the plurality of second circuit conductors are connected to the plurality of first circuit conductors.

12. The probe card substrate according to claim 11,
wherein the adjustment part includes a pair of adjustment terminals that are located on the second surface and are respectively electrically connected to two ends of a partial section of the heater wire, and
the adjustment conductor is located on the second surface and is connected to the pair of adjustment terminals.

13. The probe card substrate according to claim 11,
wherein a plurality of the adjustment parts are provided, and
the plurality of adjustment parts are disposed in a distributed manner across the second surface.

14. The probe card substrate according to claim 11,
wherein the one or plurality adjustment parts include an adjustment part located in a center part of the second surface.

15. The probe card substrate according to claim 11,
wherein the adjustment part includes inner conductors that electrically connect a pair of adjustment terminals and the heater wire to each other, and
the inner conductors include a first inner conductor that extends in a direction perpendicular to the first surface and a second inner conductor that extends in a direction along a substrate surface of the insulating substrate.

16. A probe card comprising:
the probe card substrate according to claim 11; and
a plurality of probe pins connected to the plurality of second circuit conductors.

17. A probe card comprising:
the probe card substrate according to claim 11; and
a plurality of probe pins connected to the plurality of second circuit conductors,
wherein the adjustment part includes a pair of adjustment terminals that are located on the second surface and are respectively electrically connected to two ends of a partial section of the heater wire, and
the adjustment conductor is located on the second surface and is connected to the pair of adjustment terminals.

18. A probe card comprising:
the probe card substrate according to claim 11; and
a plurality of probe pins connected to the plurality of second circuit conductors,
wherein a plurality of the adjustment parts are provided, and
the plurality of adjustment parts are disposed in a distributed manner across the second surface.

19. A probe card comprising:
the probe card substrate according to claim 11; and
a plurality of probe pins connected to the plurality of second circuit conductors,
wherein the one or plurality adjustment parts include an adjustment part located in a center part of the second surface.

20. A probe card comprising:
the probe card substrate according to claim 11; and
a plurality of probe pins connected to the plurality of second circuit conductors,
wherein the adjustment part includes inner conductors that electrically connect a pair of adjustment terminals and the heater wire to each other, and
the inner conductors include a first inner conductor that extends in a direction perpendicular to the first surface and a second inner conductor that extends in a direction along a substrate surface of the insulating substrate.

* * * * *